United States Patent
Pagani

(10) Patent No.: US 9,478,470 B2
(45) Date of Patent: Oct. 25, 2016

(54) SYSTEM FOR ELECTRICAL TESTING OF THROUGH-SILICON VIAS (TSVS), AND CORRESPONDING MANUFACTURING PROCESS

(71) Applicant: STMicroelectronics S.r.l., Agrate Brianza (IT)

(72) Inventor: Alberto Pagani, Nova Milanese (IT)

(73) Assignee: STMicroelectroncs S.r.l., Agrate Brianza (IT)

( * ) Notice: Subject to any disclaimer, the term of this patent is extended or adjusted under 35 U.S.C. 154(b) by 53 days.

(21) Appl. No.: 13/855,321

(22) Filed: Apr. 2, 2013

(65) Prior Publication Data

US 2013/0256661 A1    Oct. 3, 2013

(30) Foreign Application Priority Data

Apr. 3, 2012  (IT) .............................. TO2012A0294

(51) Int. Cl.
| | |
|---|---|
| *H01L 23/58* | (2006.01) |
| *H01L 21/66* | (2006.01) |
| *H01L 21/768* | (2006.01) |
| *H01L 21/74* | (2006.01) |

(52) U.S. Cl.
CPC ......... *H01L 22/34* (2013.01); *H01L 21/76898* (2013.01); *H01L 22/14* (2013.01); *H01L 21/743* (2013.01)

(58) Field of Classification Search
CPC .................. H01L 21/76898; H01L 23/481
USPC ......................................................... 257/48
See application file for complete search history.

(56) References Cited

U.S. PATENT DOCUMENTS

| | | |
|---|---|---|
| 2007/0058099 A1 | 3/2007 | Eguchi |
| 2010/0065949 A1 | 3/2010 | Thies et al. |

(Continued)

FOREIGN PATENT DOCUMENTS

| | | |
|---|---|---|
| EP | 2312619 | 4/2011 |
| WO | 2011101393 | 8/2011 |

OTHER PUBLICATIONS

Solid State Technology, IFTLE 10 3D at the 2010 IEEE IITC, Jun. 2010.*

(Continued)

*Primary Examiner* — Trung Q Dang
*Assistant Examiner* — Patricia Reddington
(74) *Attorney, Agent, or Firm* — Gardere Wynne Sewell LLP

(57) ABSTRACT

An embodiment of a process for manufacturing a system for electrical testing of a through via extending in a vertical direction through a substrate of semiconductor material envisages integrating an electrical testing circuit in the body to enable detection of at least one electrical parameter of the through via through a microelectronic buried structure defining an electrical path between electrical-connection elements towards the outside and a buried end of the through via; the integration step envisages providing a trench and forming a doped buried region at the bottom of the trench, having a doping opposite to that of the substrate so as to form a semiconductor junction, defining the electrical path when it is forward biased; in particular, the semiconductor junction has a junction area smaller than the area of a surface of the conductive region in a horizontal plane transverse to the vertical direction, in such a way as to have a reduced reverse saturation current.

18 Claims, 17 Drawing Sheets

(56) References Cited

U.S. PATENT DOCUMENTS

2010/0327422 A1   12/2010   Lee et al.
2011/0266674 A1   11/2011   Hsia et al.

OTHER PUBLICATIONS

Alberto Pagani, "Ultra Low Leakage TSV testing structure", FEM EWS Europe, Aug. 18, 2011, 32 pages.

Italian Search Report for Italian application serial No. IT TO20120294, Ministero dello Sviluppo Economico, Munich, Germany, Oct. 23, 2012, 2 pages.

Tezcan, Deniz S. et al: "Scalable Through Silicon Via with Polymer Deep Trench Isolation for 3D Wafer Level Packaging," 2009 Electronic Components and Technology Conference, IEEE, pp. 1159-1164.

First Office Action and Search Report from co-pending CN 201310121979.3 dated Sep. 1, 2016 (7 pages).

* cited by examiner

SYSTEM FOR ELECTRICAL TESTING OF THROUGH-SILICON VIAS (TSVS), AND CORRESPONDING MANUFACTURING PROCESS

PRIORITY CLAIM

The instant application claims priority to Italian Patent Application No. TO2012A000294, filed Apr. 3, 2012, which application is incorporated herein by reference in its entirety.

SUMMARY

An embodiment relates to an improved system for electrical testing of through-silicon vias (TSVs), and to a corresponding manufacturing process.

In the field of electrical connections of electronic integrated circuits, the use is known of so-called through-silicon vias (in what follows simply "through vias"), namely, interconnections of conductive material that extend vertically through the die or wafer of semiconductor material, in particular silicon, in which an electronic integrated circuit is provided, enabling electrical coupling of circuit elements, which are integrated at various levels of the structure of the die/wafer, to one another and possibly to at least another external element that is coupled to an external surface of the same die/wafer. Through vias extend vertically through the die/wafer and the corresponding substrate, and are possibly accessible at the end of the manufacturing process, i.e., in their final form of use, from an external surface of the die/wafer designed for coupling to an external electronic device or system (this external device/system possibly including a further die/wafer, in the case of stacked structures), possibly via a package designed to house the die/wafer. Generally, through vias are electrically insulated from the substrate that they traverse, in so far as they are insulated both at the sides and at the bottom by an electrical-insulation region, for example, made of dielectric material, in such a way as to prevent, or at least limit, the presence of leakage currents towards the substrate.

The process for manufacturing the through vias has some critical aspects, for example, due to their small dimensions, of even less than 10 µm, their high number, since even hundreds of through vias may be provided within a single die, and the high depth of the excavation within the die/wafer. Consequently, and also in view of the nature of electrical intercoupling performed by the through vias, testing of their proper operation is typically required (for example, before the manufacturing process of the integrated circuits is completed), in particular verifying the resistance of the path offered to the electrical current circulating through the through vias, and the presence of possible losses and parasitic phenomena, for example, with respect to the substrate.

In the patent application No. WO2011/101393 A1, which is incorporated by reference, a system has been described for electrical testing of at least one through via integrated within a substrate of a die or wafer of semiconductor material, in particular silicon, which envisages the integration within the substrate of a microelectronic buried structure, electrically coupled to the through via to create a conductive path and thus enable detection of at least one electrical quantity or parameter associated therewith.

This system is shown schematically and designated as a whole by 1 in FIG. 1, which shows a portion of a body 2 including semiconductor material, such as silicon (in addition to further materials, such as insulating materials, metal, etc., as will be evident to a person skilled in the field). The body 2 may be equivalently a wafer integrating a plurality of dice, or a die, which is the result of the operation of sawing of the same wafer.

The body 2 includes: a substrate 3, possibly of a composite type (such as, for example, a SOI—Silicon On Insulator—substrate made up of layers set on top of one another), with a first type of doping, for example a P doping, and having a top surface 3a, in a position corresponding to which at least one integrated circuit 4 under test is provided (the so-called DUT—Device Under Test; here it is represented schematically as including a MOS transistor), and a bottom surface 3b, opposite to the top surface 3a; and a multilayer 5, made up of one or more layers of insulating material that separate one or more layers of conductive material, for example metal (the so-called metallization layers), which are coupled to one another by vias and are set on top of one another on the top surface 3a. The integrated circuit 4 may be formed, at least in part, within this multilayer 5; for example, a gate-oxide region of a MOS transistor of the integrated circuit 4 may be defined in a first insulating layer of the multilayer 5, and a corresponding gate region in a first conductive layer of the same multilayer 5. Contact pads 6 are arranged on an external surface 5a of the multilayer 5 (opposite to the surface in contact with the top surface 3a of the substrate 3) to enable electrical access from outside to the integrated circuit 4.

At least one through via, designated as a whole by 10, is moreover present within the body 2, and includes a conductive interconnection, which extends vertically through at least part of the substrate 3 and possibly through one or more of the insulating and/or conductive layers of the multilayer 5, in such a way as to enable an electrical coupling between components of the integrated circuit 4 or conductive layers or contact pads 6 towards the back of the substrate 3 (and towards the bottom surface 3b, where suitable contact elements, in the form, for example, of conductive lands or bumps, may also be provided for electrical coupling to the outside world).

In particular, the through via 10 has a top end 10a, at which an electrical contact with the integrated circuit 4 or metallization layer or contact pad 6 is formed, and a bottom end 10b, insulated and "embedded" within the substrate 3 of the wafer 2, in a so-called bulk region thereof, separated from the bottom surface 3b of the substrate 3 by a portion of material having a given thickness. This bottom end 10b may possibly be made accessible from outside by removal of part of the substrate, starting from its bottom surface 3b, with final steps of the manufacturing process (possibly, after electrical testing of the through via 10). In detail, the through via 10 is constituted by a conductive region 11, made, for example, of metal material (such as copper or aluminium), which constitutes a central core thereof and is surrounded at the sides by an insulation region 12 (for example, made of silicon oxide), in such a way as to be electrically insulated at the sides from the substrate 3.

In order to carry out an electrical test of at least one electrical parameter of the through via 10, a testing circuit 14 is moreover integrated in the body 2 (the so-called BIST—Built-In Self Test, in the case where the test is performed automatically); testing circuit 14 is electrically coupled to the through via 10, and, moreover, is configured so as to interface with an ATE (Automatic Test Equipment), not illustrated herein. In particular, the ATE allows carrying out an automatic procedure of electrical testing and sorting of the various dice, possibly within a wafer of semiconductor material (prior to the corresponding sawing operation) in such a way as to select the dice operating properly for their subsequent packaging. This operation is known as EWS (Electrical Wafer Sorting) or WS (Wafer Sorting) and envisages execution of appropriate electrical tests on the electronic integrated circuits in the various chips, including operations of testing of the corresponding through vias, where present.

The aforesaid electrical test envisages, for example, that an appropriate test current is made to flow through the through via 10 in such a way as to evaluate the electrical resistance to the current path offered by the same through via 10. In addition, or as an alternative, this electrical test envisages measuring the electrical insulation of the through via 10 from the substrate 3 in which it is formed. It is noted that the testing circuit 14 may be configured so as to enable electrical testing of a plurality of through vias 10 contained within the body 2.

In detail, the testing circuit 14 includes an interface stage 16 and a microelectronic buried structure 18. The interface stage 16 is constituted by appropriate circuit elements (FIG. 1 shows by way of example a MOS transistor), integrated in the surface portion of the substrate 3 (in a way similar to the integrated circuit 4, for example, exploiting process steps in common with the manufacturing of the same integrated circuit 4), and is configured so as to be electrically coupled to one or more of the contact pads 6 accessible from outside, with the top end 10a of the through via 10, and moreover so as to be electrically coupled, via an appropriate conductive path traversing the substrate 3, designated as a whole by 19, with the microelectronic buried structure 18. In particular, the interface stage 16 is electrically coupled to the substrate 3 in a region corresponding to a substrate contact, designated by 19a (this substrate contact 19a may include a vertical coupling designed to reach a buried layer of the substrate 3, in the case, for example, of a SOI structure). In a way not shown, the interface stage 16 includes suitable elements and components, such as switches, multiplexers, or counters, for providing a selective coupling between contact pads 6 and through vias 10 so as to enable access to, and testing of, the same through vias 10 by probes of the test equipment, designed to contact the contact pads 6.

The microelectronic buried structure 18 is provided within the bulk region of the substrate 3 in such a way as to be in contact with the bottom end 10b of the through via 10, and includes at least one doped region 20, having, for example, a type of doping opposite to that of the substrate 3, in this example an N doping. The doped region 20 is set at the bottom of the through via 10, entirely in contact with its conductive region 11, terminating laterally in contact with the insulation region 12. In the example illustrated, the doped region 20 forms with the substrate 3 a PN semiconductor junction, i.e., a semiconductor diode (as shown schematically in FIG. 1), having its anode terminal constituted by the substrate 3 and its cathode terminal constituted by the doped region 20, electrically in contact with the bottom end 10b of the through via 10. The doped region 20 has a horizontal extension, in a horizontal plane xy, transverse to the direction of vertical extension z of the through via 10 through the substrate 3, substantially equivalent to the horizontal extension of the through via 10. Dimensions of the doped region 20 along the horizontal axes x and y of the horizontal plane xy are greater than or equal to the corresponding dimensions of the conductive region 11 of the through via 10, and in particular the surface of the doped region 20 in the horizontal plane xy is greater than or equal to the surface of the bottom end 10b of the through via 10.

In use, the presence of the testing circuit 14 within the body 2, accessible from outside via one or more of the contact pads 6, enables electrical testing of the through via 10, for example, by passage of a test current I that is made to circulate through the interface stage 16, the conductive path 19 in the substrate 3, the microelectronic buried structure 18, the through via 10, and once again through the interface stage 16 towards the contact pads 6. The semiconductor diode constituted by the junction between the doped region 20 and the substrate 3 is, in this case, forward biased so as to enable passage of the test current I through the through via 10. It is thus possible, for example, to evaluate, using an ATE coupled to the contact pads 6, the resistance offered by the through via 10 to the path of the test current I. Instead, when the semiconductor diode is reverse biased (for example, during electrical testing of other components of the integrated circuit 4 by the same ATE), it insulates electrically the through via 10 from the substrate 3.

FIG. 2 shows in a schematic and simplified way the testing system 1 described previously, with the testing circuit 14 electrically coupled to a plurality of through vias 10 provided in the body 2 and traversing the substrate 3, and in particular: a first through via 10', which extends from the top surface 3a to the back of the substrate 3; a second through via 10", which extends from a metallization layer (here not illustrated in detail) of the multilayer 5 to the back of the substrate 3; and a third through via 10''', which extends from the external surface 5a of the multilayer 5 (defined by a last passivation layer, here not illustrated in detail) to the back of the substrate 3. The rear end 10b of each of the through vias 10, in particular of the corresponding conductive region 11 (not illustrated in FIG. 2), is electrically insulated from the substrate 3 by means of a respective semiconductor diode (defined by a respective microelectronic buried structure 18). FIG. 2, moreover, shows a probe 22 of the test equipment (not illustrated as a whole), designed to be electrically coupled to a contact pad 6 during the electrical-testing operation.

The path of the testing current I is also highlighted in FIG. 2, where a resistive element 23 schematically represents the resistance that the testing current I encounters in the substrate 3. In the same FIG. 2 designated by $I_S$ is the reverse-saturation current that may circulate in the semiconductor diode when it is reverse biased (for a through via 10 not undergoing the testing operation, or undergoing a test to evaluate its electrical insulation).

With reference first to FIG. 3a the process is now illustrated for manufacturing a through via 10 within the body 2, and at a same time the microelectronic buried structure 18, and in particular the doped region 20 in contact with the bottom end 10b of the through via 10, as described in the aforesaid patent application No. WO2011/101393A1, which is incorporated by reference.

By means of a first step of masking (which envisages formation of an appropriately patterned resist layer 25a on the outer face of the body 2, for example corresponding to the external surface 5a of the multilayer 5) and etching, for example through anisotropic chemical etching, an annular trench 26 is defined, which extends in a surface portion of the substrate 3, for a desired depth. For example, the annular trench 26 has, in top plan view, the shape of a circular ring, defining inside it a cylindrical portion 27 of the substrate 3.

Next (FIG. 3b), the annular trench 26 is filled with an insulating material, such as, for example, an oxide, a dielectric material, or a polymer, via an appropriate process, such as, for example, a thermal-oxidation process, or a process of chemical vapor deposition (CVD). The excess insulating material is removed from the outer face of the body 2, for example, by means of an operation of chemical-mechanical polishing (CMP). At the end of the process, formed within the annular trench 26 is the insulation region 12, which will form part of the through via 10.

Next (FIG. 3c), via a second step of masking (with the formation of a further appropriately patterned resist layer 25b) and etching, the cylindrical portion 27 of the substrate 3 enclosed within the insulation region 12 is removed, thus creating a hole 28, which is also cylindrical in shape. In particular, the depth of the etch corresponds in this case to the height, in the vertical direction z, of the insulation region 12.

Next (FIG. 3d), doping of the portion of the substrate 3 underlying the hole 28 is carried out, for example, via diffusion at high temperature or via ion implantation followed by thermal annealing, to obtain the doped region 20, at the bottom of the hole 28, for example, having a doping of an N type. The doped region 20 extends laterally also in part underneath the insulation region 12, as a result of the lateral diffusion of the dopants, assuming a horizontal extension greater than the diameter of the hole 28.

Then (FIG. 3e), the hole 28 is filled with a conductive material, such as, for example, copper or tungsten, using a CVD process or an electroplating process, to form the conductive region 11 of the through via 10.

At the end of the process, a through via 10 of conductive material is thus obtained, insulated from the substrate 3 at the sides via the insulation region 11 and vertically via the PN junction formed between the doped region 20 and the substrate 3. In particular, the through via 10 is coupled in series with a semiconductor diode (formed by the junction between the doped region 20 and the substrate 3), which is set in direct electrical contact with its bottom end 10b in the substrate 3.

The electronic integrated circuit 4 may be provided in the surface portion of the substrate 3 in this step of the process, possibly concurrently with formation of the interface stage 16 of the testing circuit 14. In particular, the doped region 20 may be provided by exploiting doping steps already envisaged for formation of transistors (or other electrical components) of the electronic integrated circuit 4 or of the testing circuit 14.

According to a variant of the process described, shown in FIG. 4, the etch that leads to formation of the hole 28 may have a depth lower than the height of the insulation region 12 in the vertical direction z so that the doped region 20 comes to be delimited laterally by the insulation region 12 itself (having in this case a horizontal extension equal to the diameter of the hole 28).

The testing system 1 described in the aforesaid patent application No. WO2011/101393 A1, and described briefly above, has several advantages, amongst which that of enabling use of test equipment of a traditional type for electrical testing of the through vias 10, which interface, in fact, with the testing circuits 14 through the contact pads 6, thus preventing the constraints linked to the small dimensions of the through vias (which may have a diameter even smaller than 10 μm) and their reduced mutual separation distance, and moreover preventing possible damage to the same through vias 10 by the probes 22 of the test equipment.

An embodiment is a system for testing through vias in a body of semiconductor material that will constitute an improvement on the system described previously.

BRIEF DESCRIPTION OF THE DRAWINGS

For a better understanding of the present disclosure, one or more embodiments are now described, purely by way of non-limiting example and with reference to the attached drawings, wherein:

FIGS. 8a-12a show sections through a body of semiconductor material in successive steps of a manufacturing process for obtaining the testing system of FIG. 7, according to an embodiment;

FIGS. 8b-12b show top plan views corresponding to the process steps of FIGS. 8a- 12a, according to an embodiment;

FIGS. 13a-16a show sections through a body of semiconductor material in successive steps of a manufacturing process for obtaining the testing system, according to another embodiment;

FIGS. 13b-16b show top plan views corresponding to the process steps of FIGS. 13a-16a, according to an embodiment;

DETAILED DESCRIPTION

An embodiment derives from the realization that the testing system 1 described above has some drawbacks that do not enable full exploitation of its advantages.

In particular, the PN junction between the doped region 20 of the microelectronic buried structure 8 and the substrate 3 intrinsically has a reverse saturation current $I_S$, the value of which may be comparable with a leakage current determined by a possible defect present in the device under test. Consequently, the presence of this reverse saturation current $I_S$ may mask the leakage current of the possible defect to the point where the electrical testing procedure will be unable to detect the presence of the defect.

Figure 1:
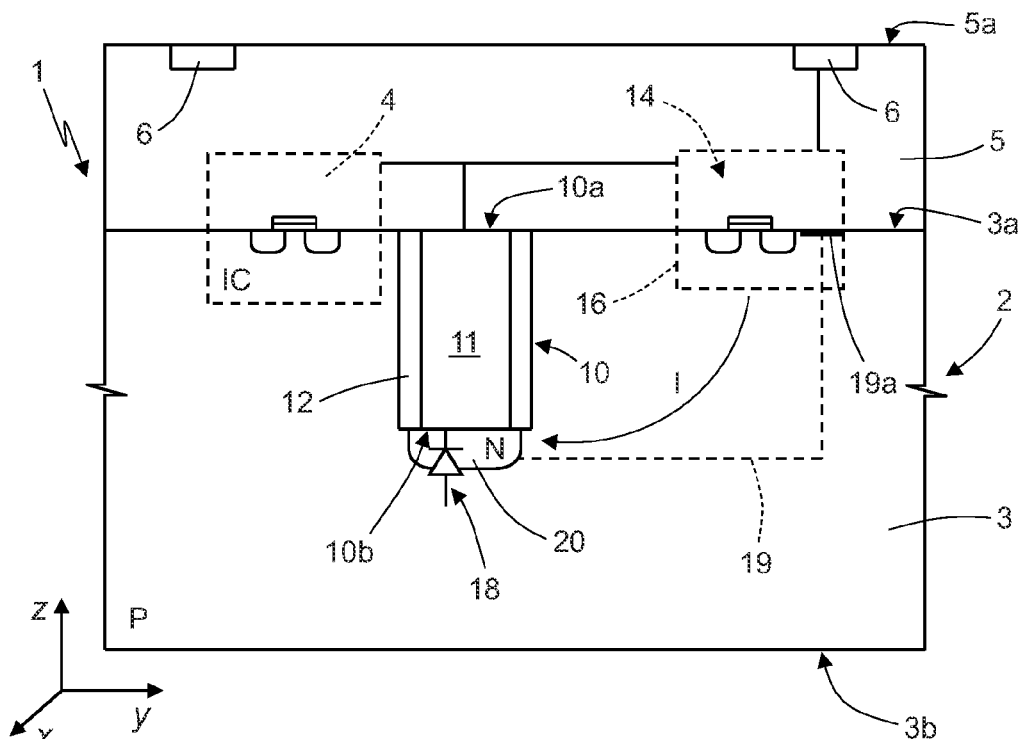
FIG. 1 is a schematic cross section of a system for testing through vias of a known type.
Figure 2:
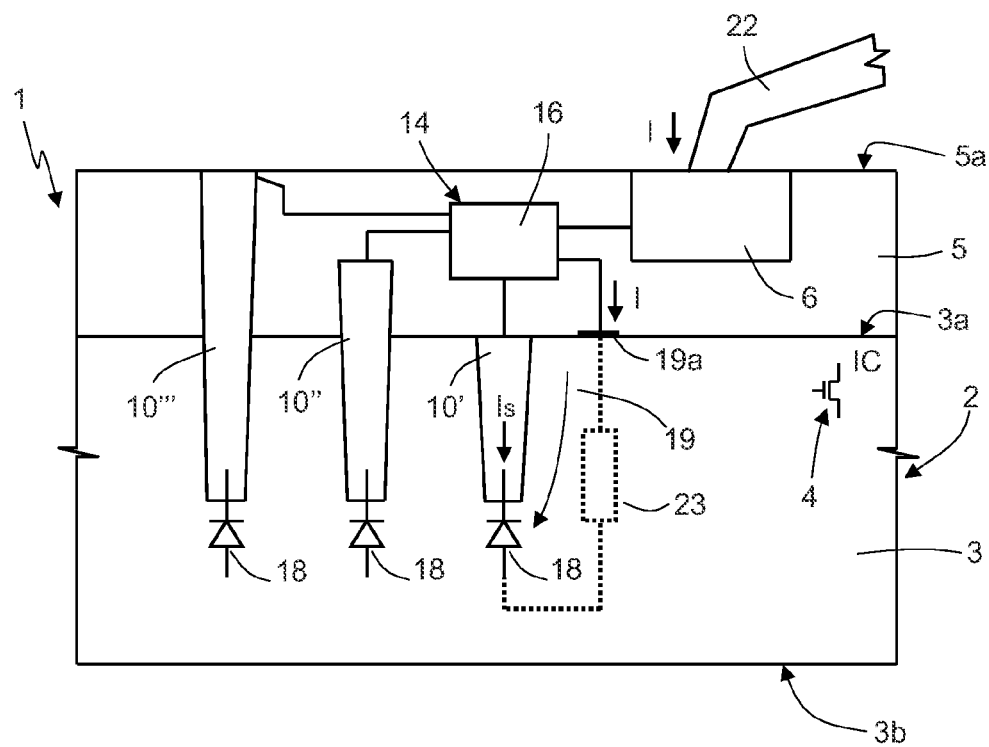
FIG. 2 is a schematic representation of the testing system of FIG. 1.
Figure 3A:
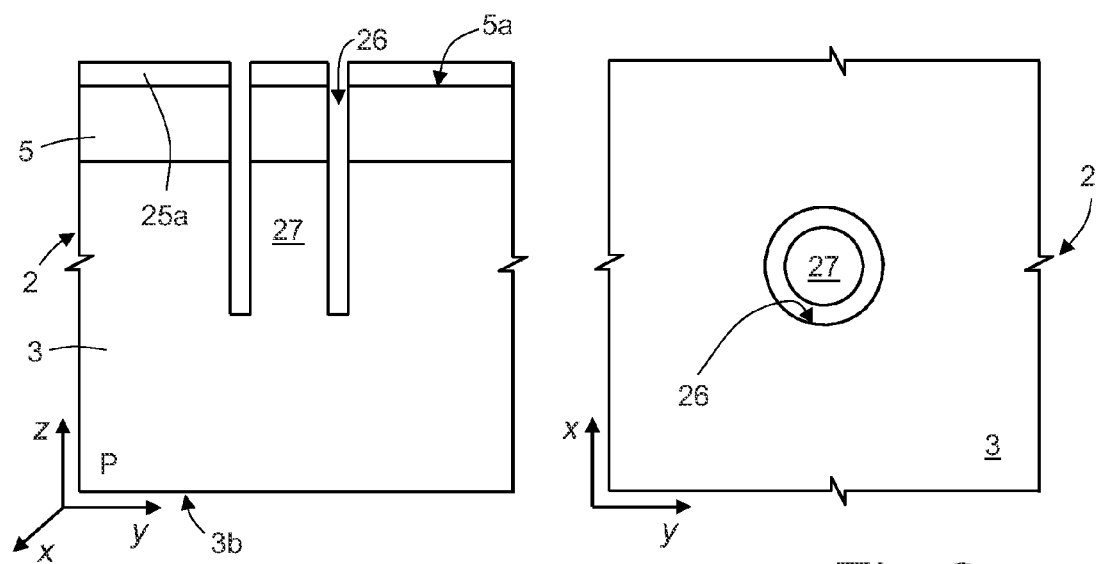
FIGS. 3a-3e show sections through a body of semiconductor material in successive steps of a manufacturing process for formation of a through via and of a corresponding integrated testing structure in the testing system of FIG. 1.
Figure 3B:
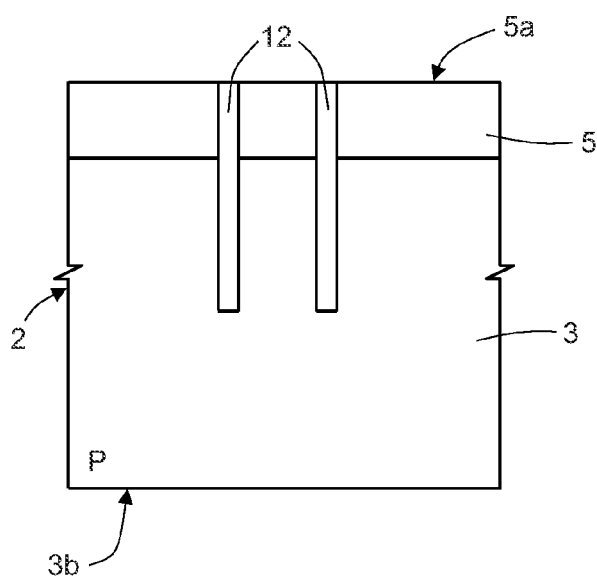
Figure 3C:
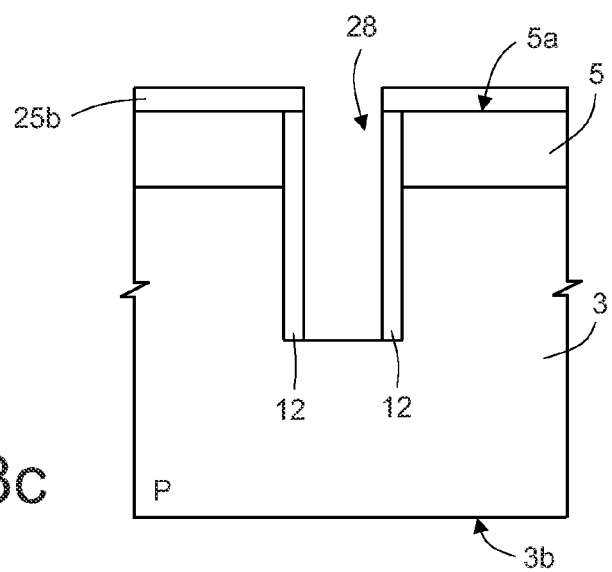
Figure 3D:
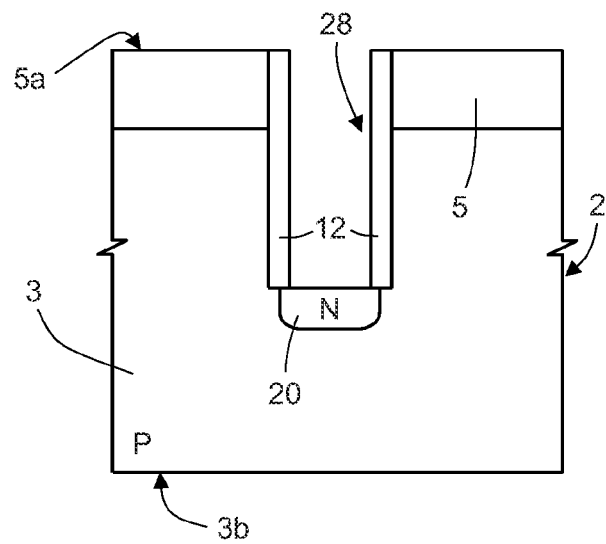
Figure 3E:
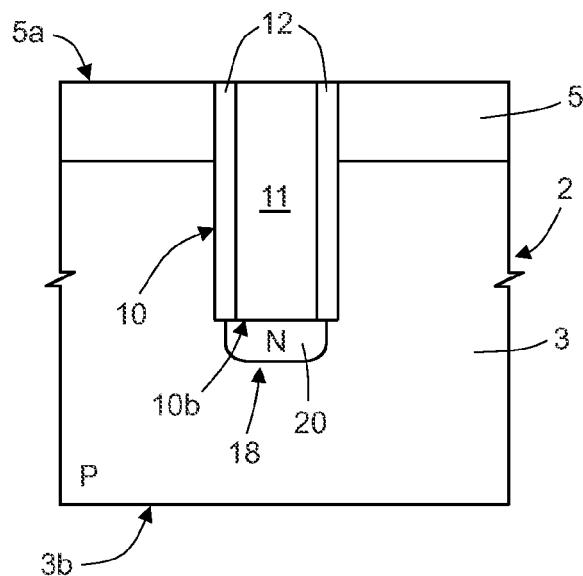
Figure 4:
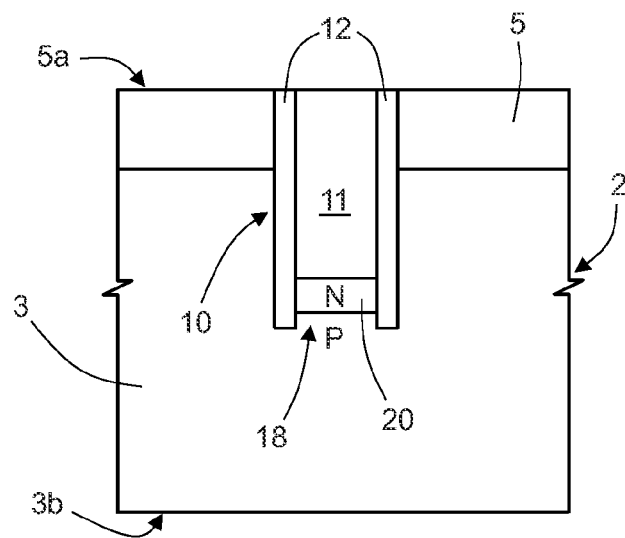
FIG. 4 is a cross section through the body of semiconductor material in a variant of the manufacturing process for obtaining the through via and the corresponding integrated testing structure of FIGS. 1 and 2.
Figure 5:
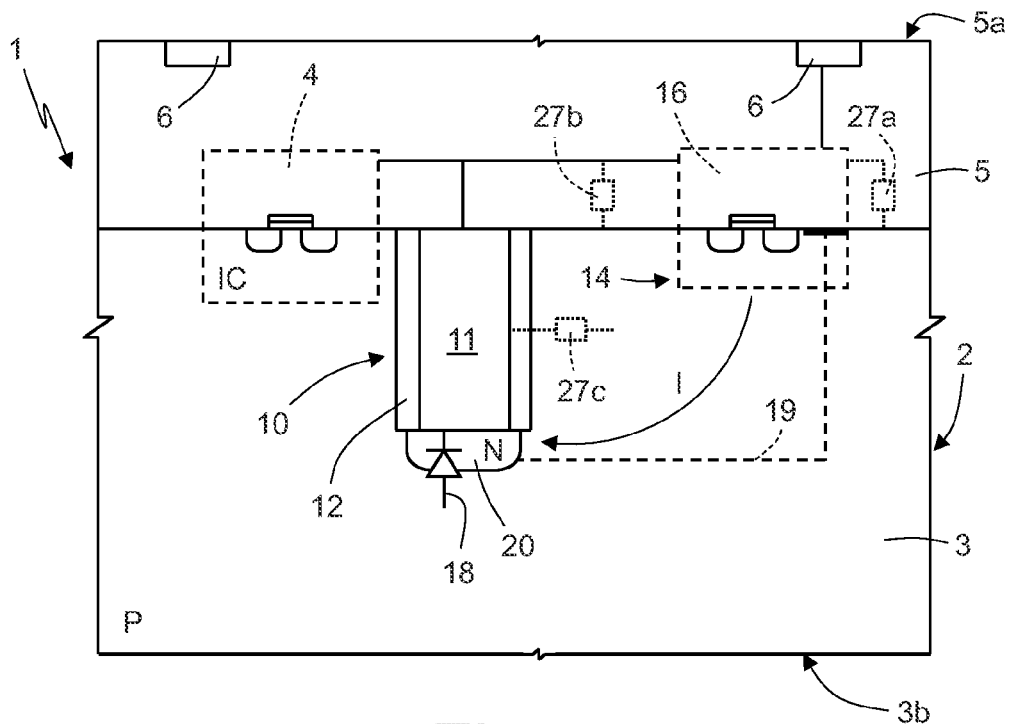
FIG. 5 shows a cross section of a portion of the testing system of FIG. 1, with possible defects highlighted therein.
Figure 6:
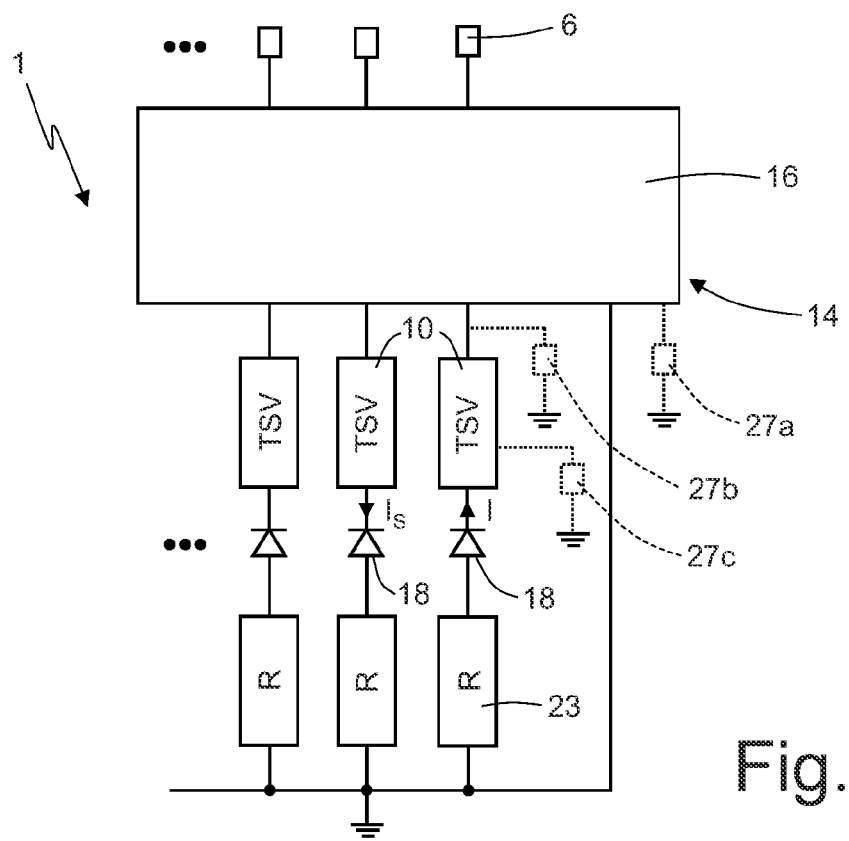
FIG. 6 shows an equivalent circuit of the system of FIG. 5, with the possible defects highlighted therein.

By way of example, FIGS. 5 and 6 are schematic illustrations of some defects that may not be detected by the testing system 1, owing to the presence of the reverse saturation current $I_S$, and in particular: a first defect, designated by 27a, due to an undesirable (resistive or capacitive) coupling between the testing circuit 14 and the substrate 3

(set at a reference voltage, for example ground); a second defect, designated by 27b, due to an undesirable coupling between a line, for electrical coupling between the testing circuit 14 and the through via 10, and the substrate 3; and a third defect, designated by 27c, due to an undesirable coupling between the through via 10 and the substrate 3, on account of a loss of lateral insulation through the insulation region 12.

As will be discussed in detail in what follows, an embodiment envisages, as a whole, reduction of the reverse saturation current $I_S$ of the PN junction buried underneath the through via 10 in such a way that it will not mask the leakage current due to possible defects in the device under test (i.e., in such a way that it is not comparable with the leakage current, it being, for example, lower than the leakage current by at least approximately one order of magnitude).

In particular, it is proposed for this purpose to reduce the area of the PN junction traversed by the testing current I. In fact, in a known way, the reverse saturation current $I_S$ of a PN junction is given by the following expression $$I_S = J_S \cdot A_D$$

where $J_S$ is the reverse saturation current density of the junction, depending in a known way upon the concentrations of dopants, and $A_D$ is the area of the junction, to a first approximation developing in the horizontal plane xy, transverse to the flow of the testing current I.

Given the same reverse saturation current density $J_S$, a reduction of the junction area $A_D$ hence determines a corresponding reduction in the reverse saturation current $I_S$.

Figure 7:
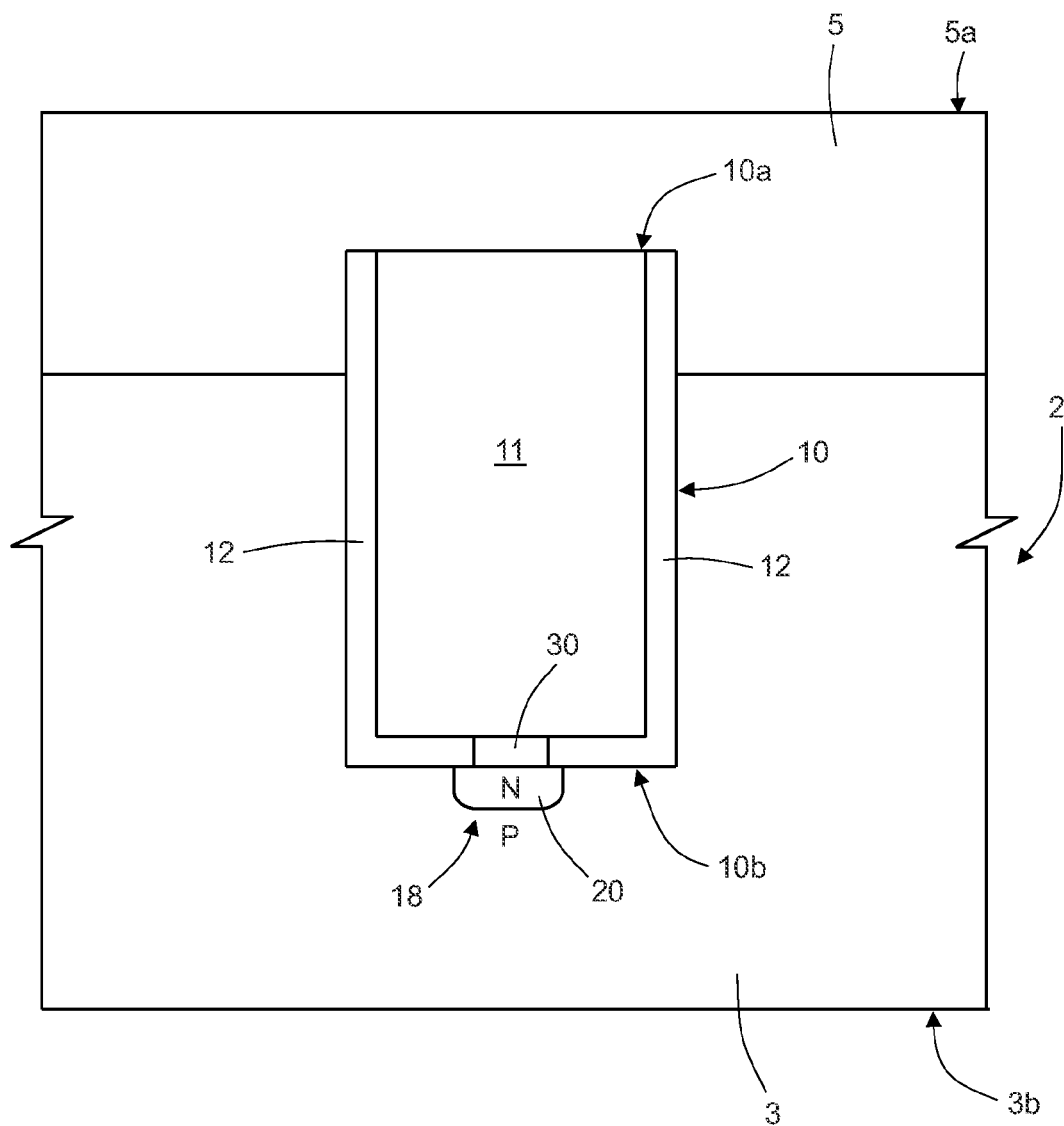
FIG. 7 shows a cross section of a portion of a system for testing through vias, according to an embodiment.
Figure 7:
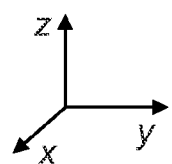

FIG. 7 shows a through via, once again designated by 10, and a corresponding microelectronic buried structure, once again designated by 18, provided for electrical testing of the same through via 10 (FIG. 7 shows only a portion of the testing system 1 relevant for an understanding of an embodiment; for the parts of the testing system 1 that are not shown, reference may be made entirely to what has been described previously with reference to patent application No. WO2011/101393 A1, insofar as the parts of the testing system that are not shown and the corresponding parts disclosed in the referenced patent application may be substantially similar.

In particular, the insulating region 12 of the through via 10, in addition to being set laterally in contact with the conductive region 11 of the same through via 10, is, in this case, also set underneath the conductive region 11, defining the bottom end 10b thereof, except for a central portion, in which the insulating region is absent. In an area corresponding to this central portion, a vertical projection, designated by 30, of the conductive region 11 is, instead, present.

The doped region 20 is set underneath this central portion, in contact with the vertical projection 30, defining, with the substrate 3, the PN junction of the microelectronic buried structure 18. The junction area $A_D$, defined to a first approximation by the extension of the doped region 20 in the horizontal plane xy (neglecting the lateral surface of the PN junction), substantially corresponds to the extension of the aforesaid central portion, and is hence smaller than the surface in the same horizontal plane xy of the conductive region 11 of the through via 10 (note that the surfaces being compared are set in two parallel planes); in particular, the junction area $A_D$ is comprised between about 1% and 90%, for example, between about 5% and 50%, of the corresponding surface of the conductive region 11, it being, for example, equal to 10% of this surface, and is in any case advantageously small, as likewise small is the corresponding reverse saturation current I.

A first embodiment of a process for manufacturing the through via 10 and the corresponding microelectronic buried structure 18, including at least the doped region 20, is now described.

Figure 8A:
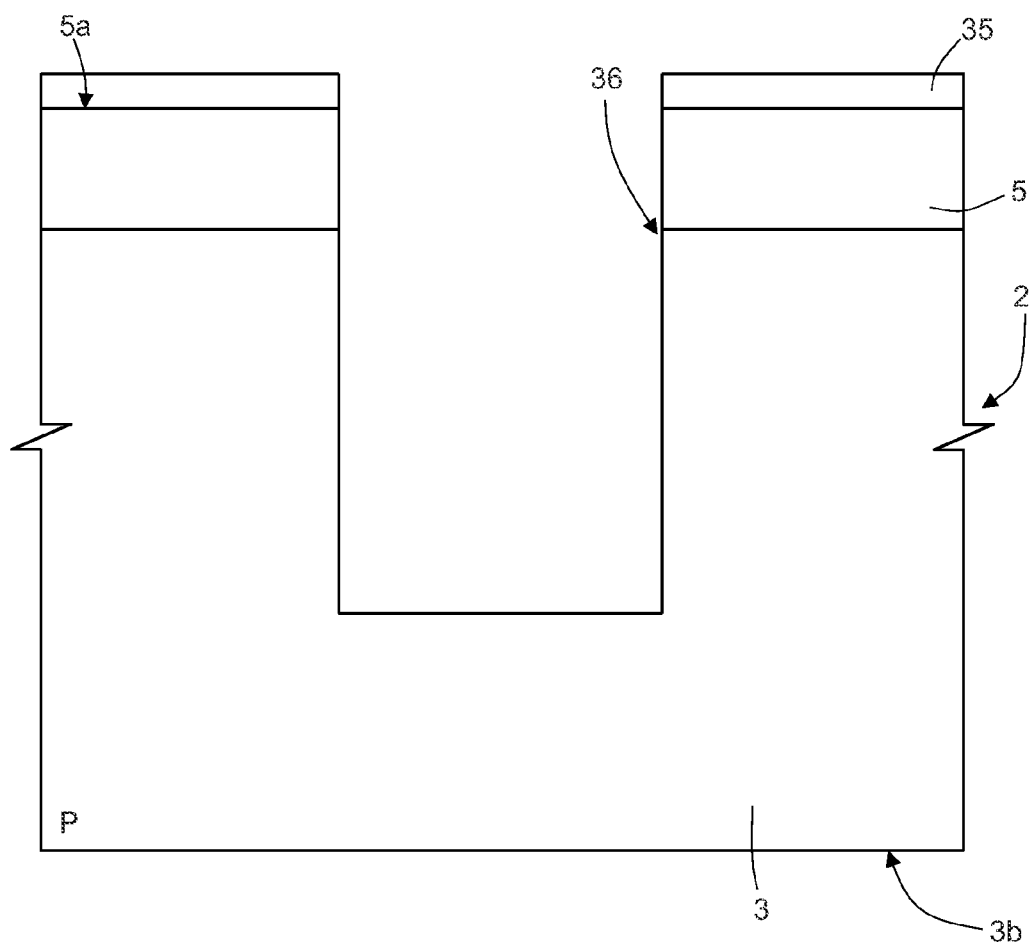
Figure 8B:
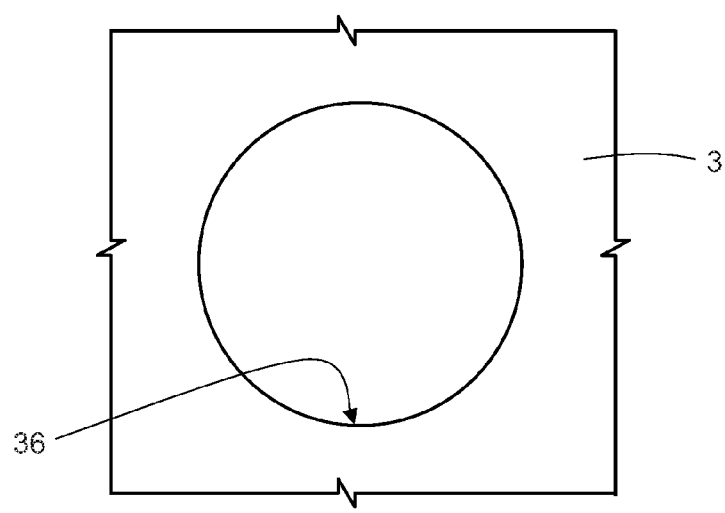

In detail, in a first step, shown in FIGS. 8a and 8b, a mask layer 35 is formed, for example including a photoresist, appropriately patterned, on the outer face of the body 2, for example corresponding to the external surface 5a of the multilayer 5 overlying the substrate 3. A chemical etch through the mask layer 35 is then carried out, for removal of a surface portion of the substrate 3 (and of the overlying portion of the multilayer 5) and definition of a trench or hole 36 having a substantially cylindrical shape and a desired depth within the substrate 3 (note that the geometrical shape of the trench is not to be considered limiting).

Figure 9A:
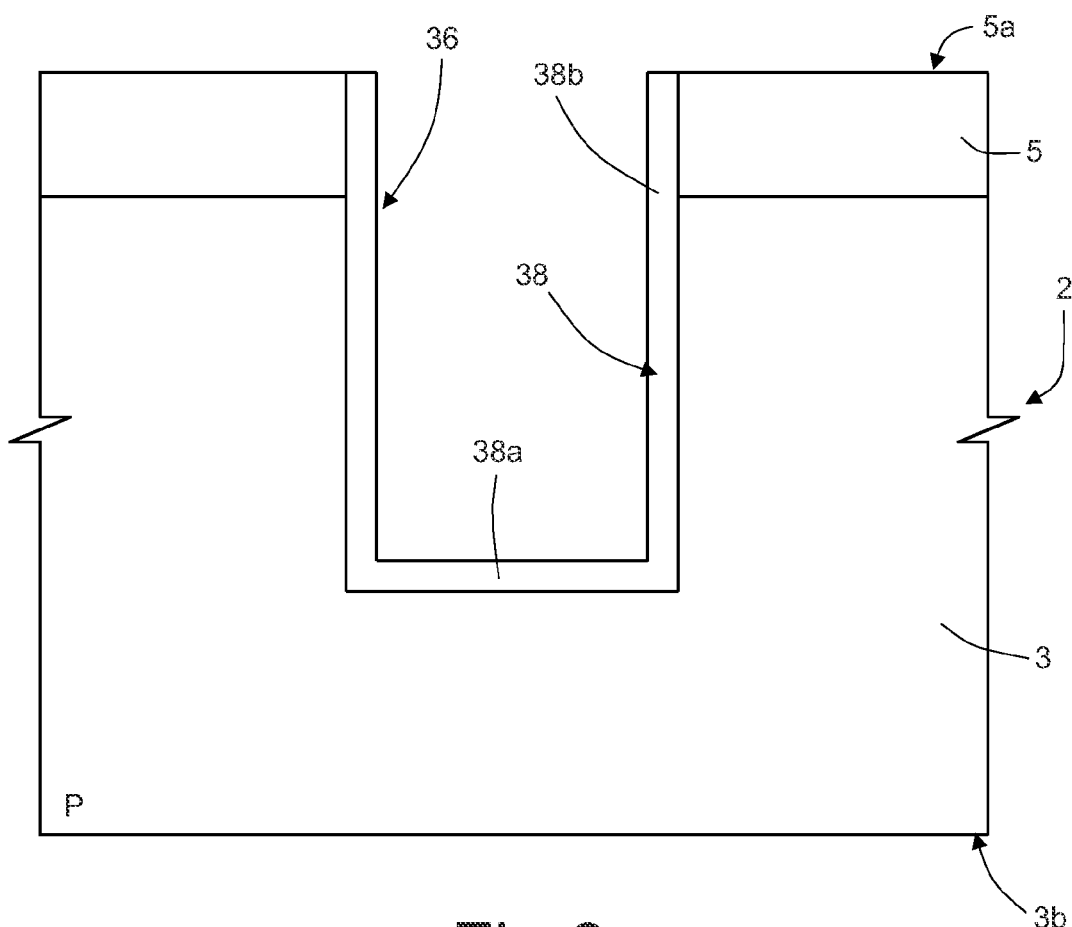
Figure 9B:
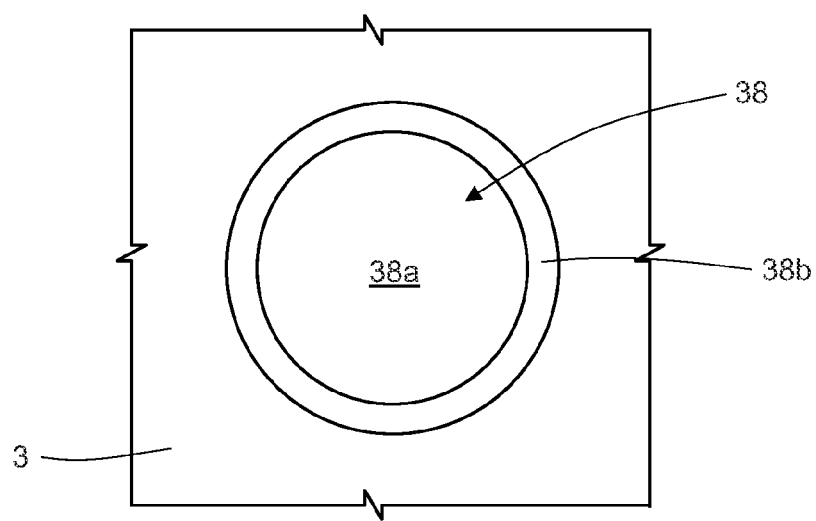

Next (FIGS. 9a, 9b), the internal walls of the trench 36 (and in particular the corresponding lateral and bottom surfaces) are entirely coated by a coating of insulating material, such as, for example, an oxide, a dielectric material, or a polymer, via an appropriate process, for instance, a thermal-oxidation process, or a process of chemical vapor deposition (CVD). The insulating material possibly formed on top of the external surface 5a is removed, for example, by means of an operation of chemical-mechanical polishing (CMP). At the end of this process step, in the trench 36 an insulating coating 38 is thus formed, having a hollow cylindrical conformation, with a base 38a and a side wall 38b.

Figure 10A:
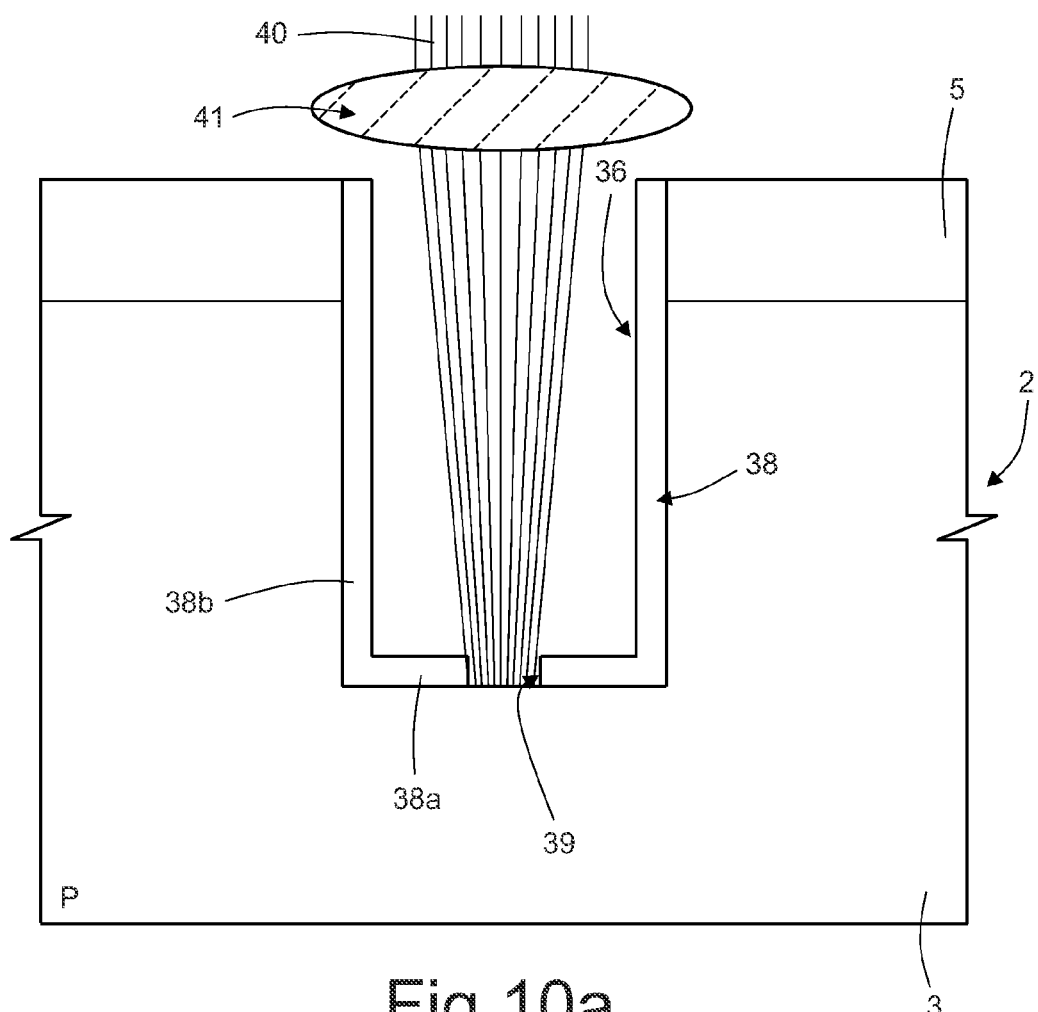
Figure 10B:
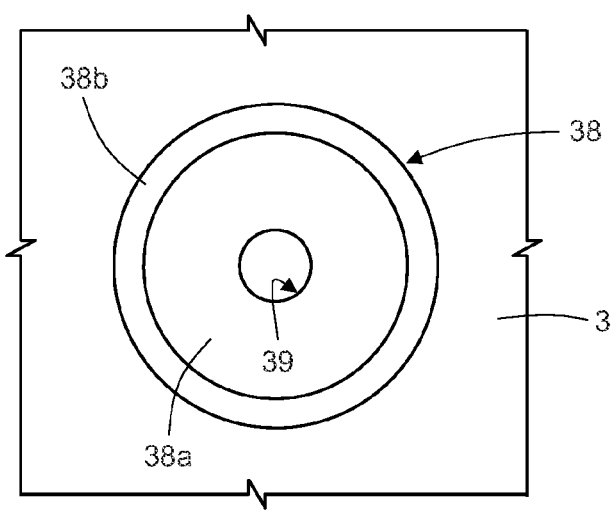

Next (FIGS. 10a, 10b), a hole 39 is opened throughout the thickness of the base 38a of the insulating coating 38, at a localized portion thereof, for example set in a central position with respect to the base 38a. In particular, as will emerge clearly hereinafter, the extension of this localized portion, and of the resulting hole 39, determines the extension of the area $A_D$ of the PN junction that will then be formed.

In order to obtain a selective removal of material that is so localized (it should be recalled that the diameter of the entire through via 10 may be even smaller than 10 µm), an embodiment envisages the use of a laser beam 40 oriented within the trench 36 and appropriately focused by a lens system 41. After the selective removal of material, via laser ablation, a removal treatment of the possible remaining debris may be envisaged, for example, cleaning via an appropriate chemical-washing process.

Figure 11A:
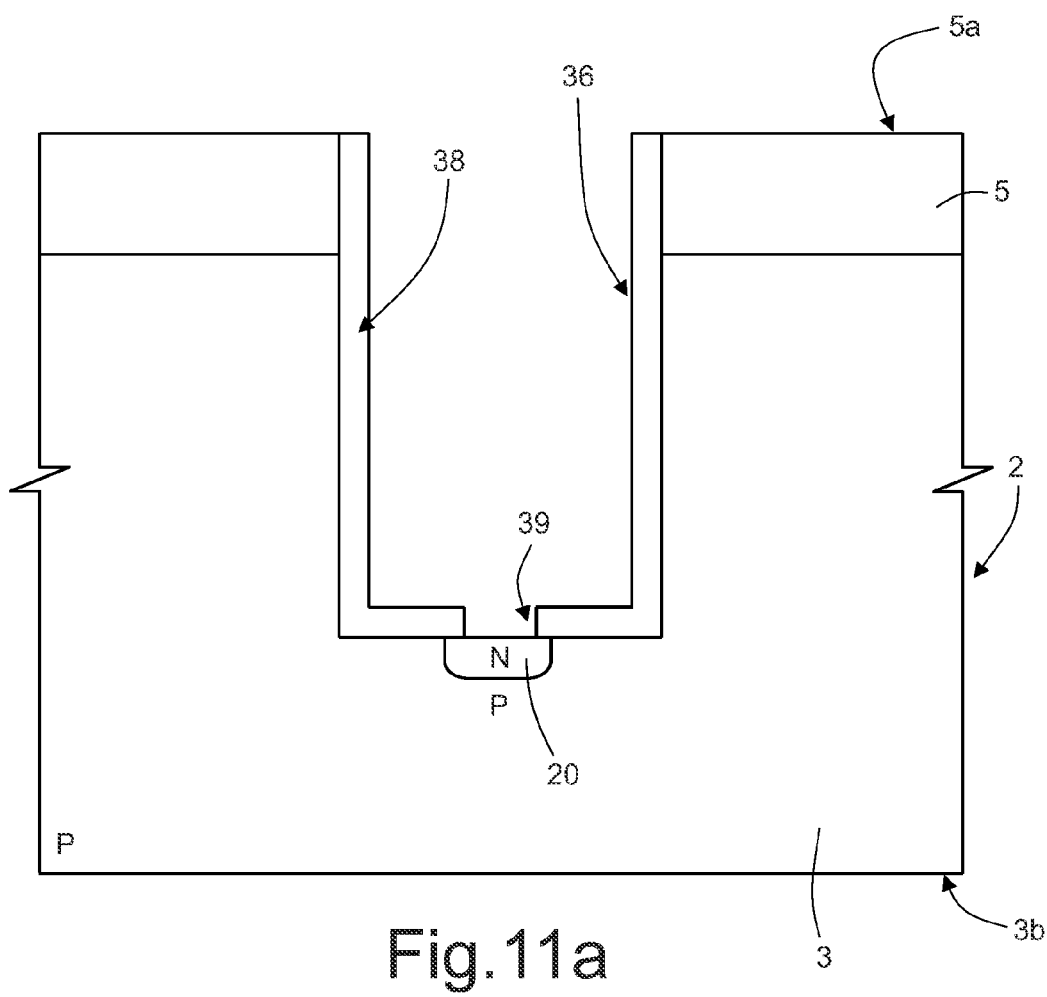
Figure 11B:
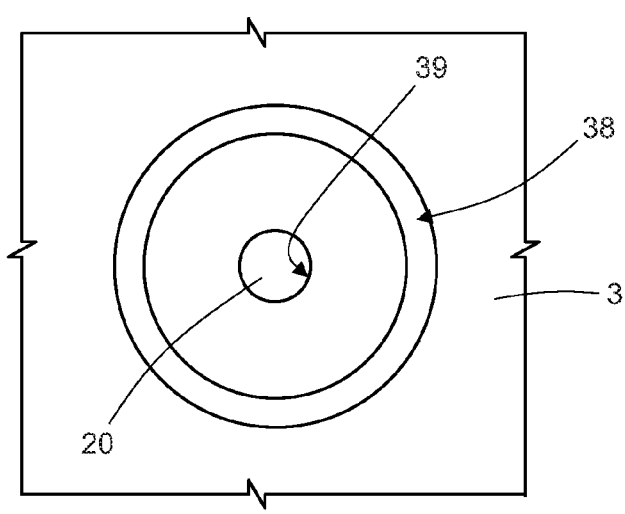

Next (FIGS. 11a, 11b), doping of the portion of the substrate 3 underlying the hole 39 is carried out, for example via diffusion at high temperature or via ion implantation followed by thermal annealing, to obtain formation of the doped region 20, for example, having a doping of an N type, opposite to that of the substrate 3. The doped region 20 extends laterally underneath the hole 39 also in part underneath the base 38a of the insulating coating 38, as a result of the lateral diffusion of the dopants, assuming a horizontal extension greater than the diameter of the hole 39 (in particular, having in cross section a substantially circular conformation with a diameter greater than that of the hole 39). In any case, the size of the hole 39 is designed in such a way that the desired size parameters for the junction area $A_D$, as previously defined, will subsequently be satisfied.

Figure 12A:
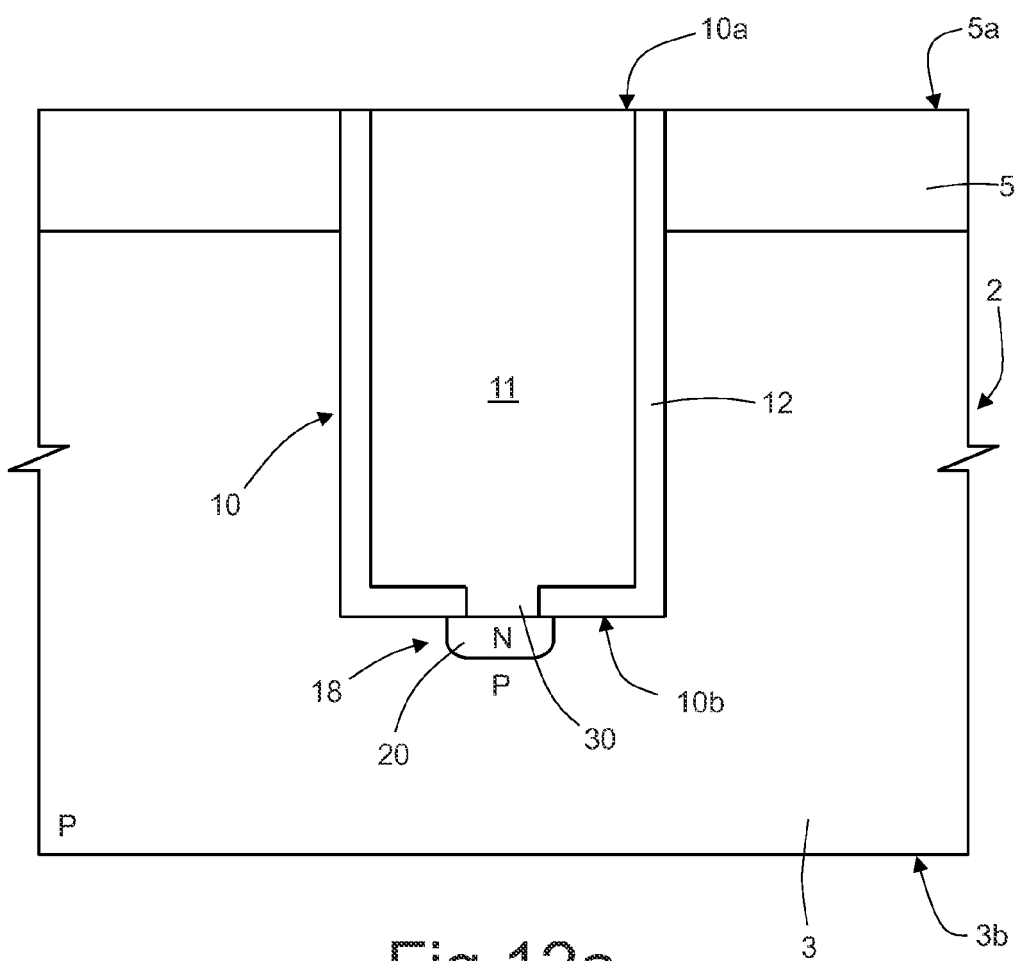
Figure 12B:
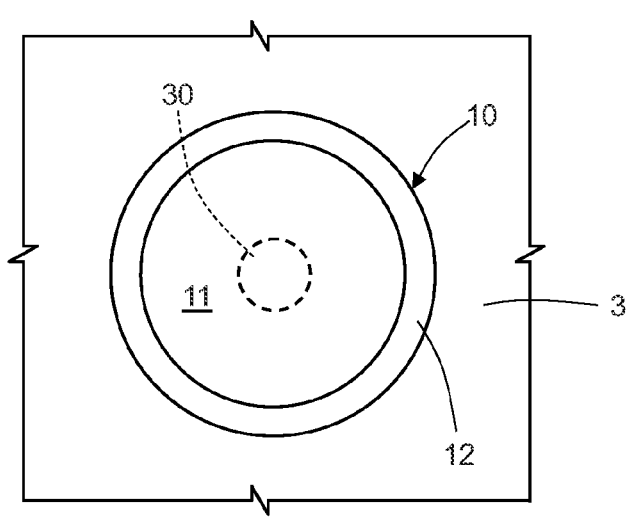

Next (FIGS. 12a, 12b), the trench 36 is completely filled with a conductive material, such as for example aluminium, polysilicon, copper, or tungsten, using, for example, a CVD process or an electroplating process, so as to form the conductive region 11 of the through via 10, and. in particular, the vertical projection 30 that fills the hole 39 and comes into contact with the doped region 20 (providing the electrical contact between the through via 10 and the microelectronic buried structure 18).

According to a variant, in the case where materials are used that may be a source of contamination for the circuits integrated in the body 2, thus possibly impairing proper operation thereof, suitable known materials may be used, such as, for example, tantalum nitride (TaN), operating as a barrier and blocking this contamination phenomenon. For example, a barrier layer (not shown in any of the attached figures) may be present between the conductive region 11 and the insulating region 12, contacting also the doped region 20.

At the end of the process, the through via 10 of conductive material is thus provided, insulated from the substrate 3 laterally via the insulation region 12 and vertically via the same insulation region 12 and, limitedly to the central localized portion, via the PN junction formed between the doped region 20 and the substrate 3. In particular, the through via 10 is coupled in series with a semiconductor diode (formed by the junction between the doped region 20 and the substrate 3), set in direct contact with the vertical projection 30 at its bottom end 10b in the substrate 3.

As illustrated previously in FIG. 7, at the end of the formation of the through via 10, one or more layers of the multilayer 5 may be grown on its top end 10a in the case where the same top end 10a is not designed to contact the contact pads 6 at the front surface 5a of the multilayer 5 and in general at the external surface of the body 2.

A second embodiment of the manufacturing process differs from the aforesaid first embodiment in that it does not envisage any step of masking and etching for formation of the through via 10 and of the corresponding microelectronic buried structure 18.

Figure 13A:
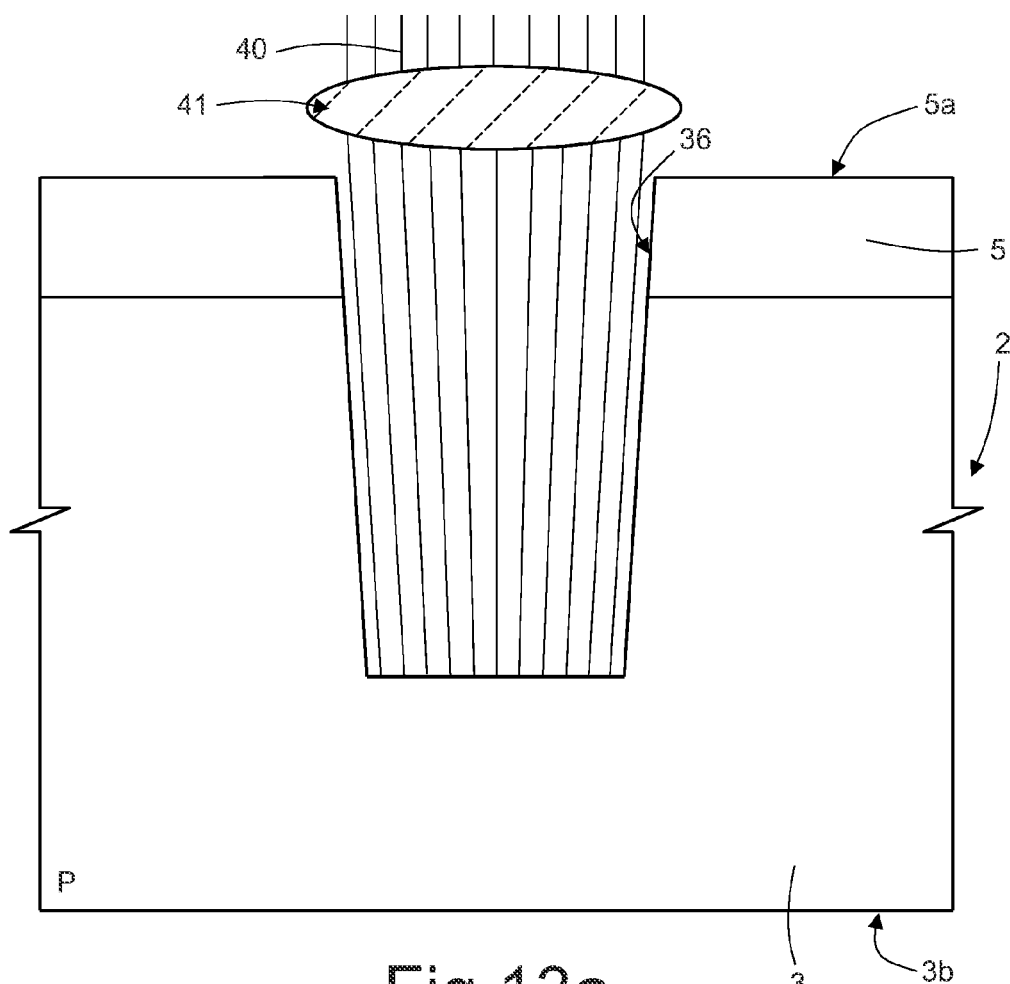
Figure 13B:
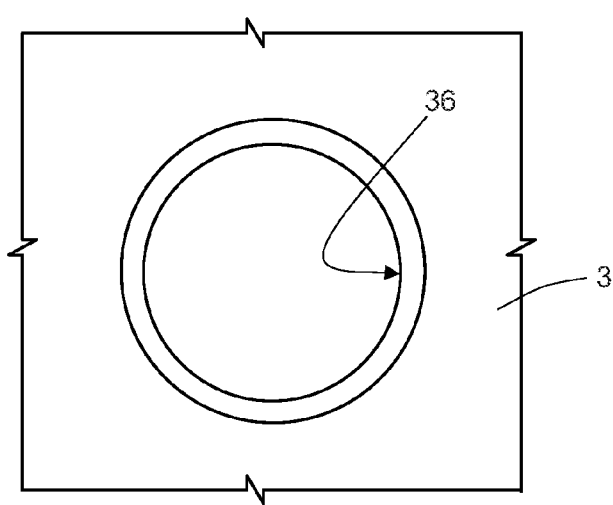
Figure 14A:
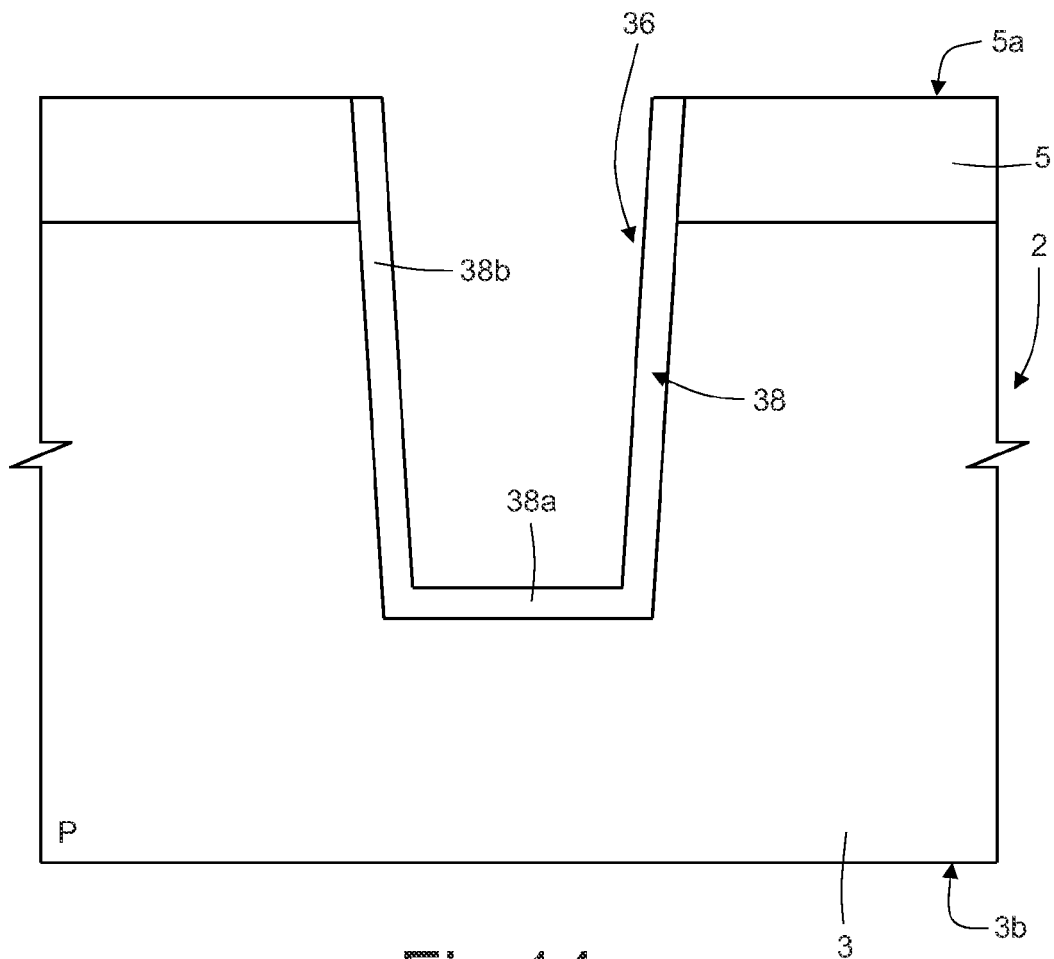
Figure 14B:
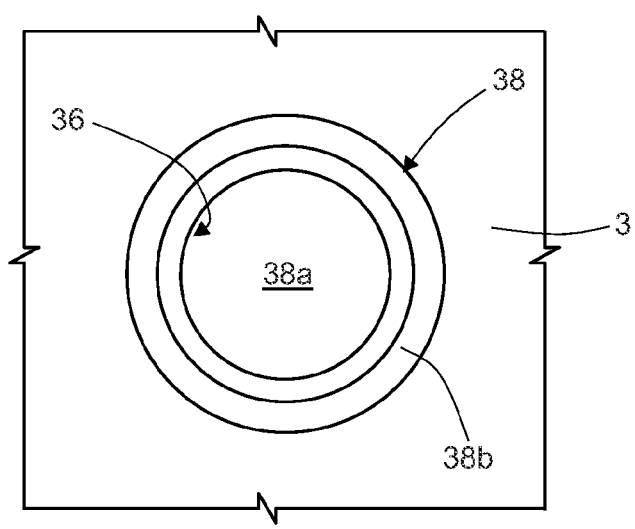

In detail, in a first step of the process, shown in FIGS. 13a, 13b, the trench (or hole) 36 is provided by removal of material by means of the laser beam 40, appropriately focused and oriented towards the body 2 by an appropriate optical system, for example, the lens system 41 (the internal walls of the trench 36 may in this case be inclined with respect to the vertical direction z, and the same trench may have a frusto-conical conformation, instead of being substantially cylindrical, as in the first embodiment). Once again, after the step of selective removal of material, a cleaning step of the surfaces that have been dug may advantageously be envisaged, for removal of possible debris, for example, by means of a chemical-washing process. According to a variant, it is possible to use treatments to eliminate any possible lattice defects due to the action of the laser, such as, for example, a chemical etching or a thermal annealing.

Figure 15A:
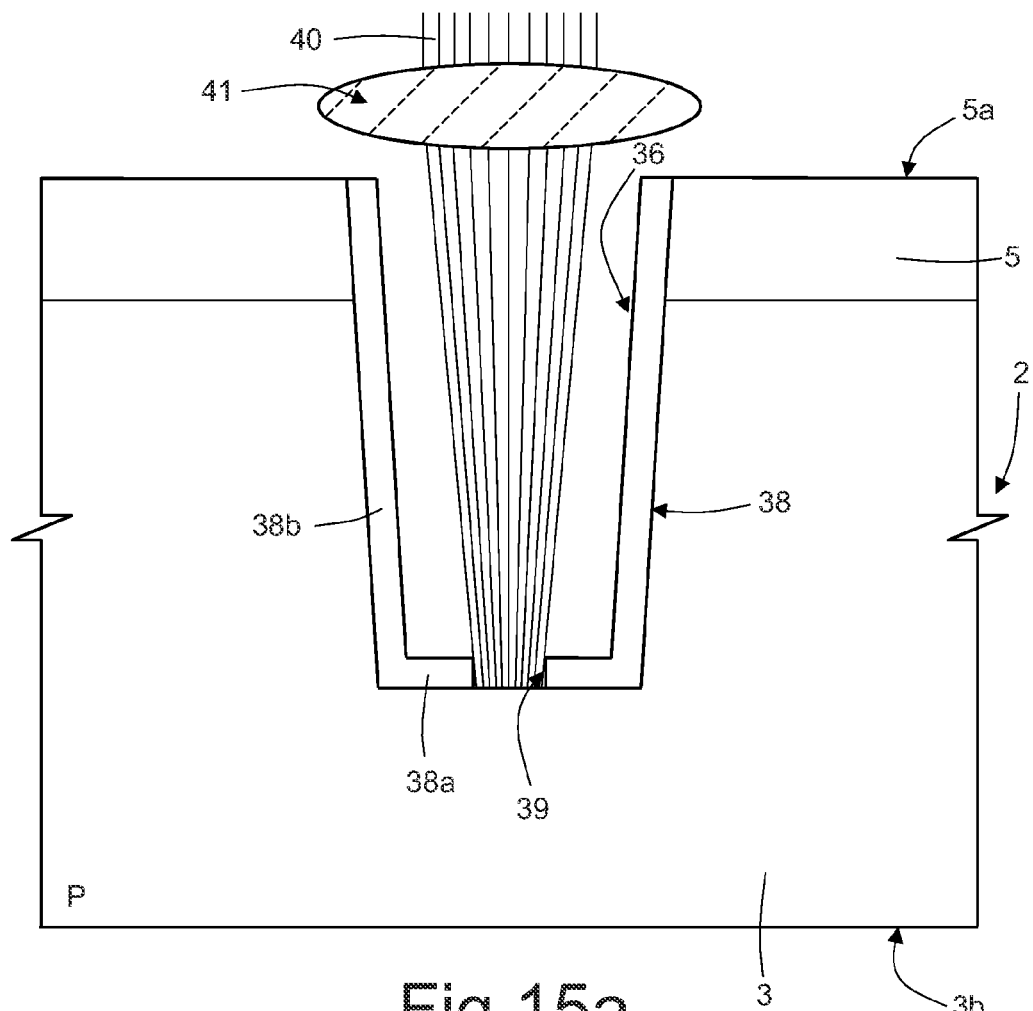
Figure 15B:
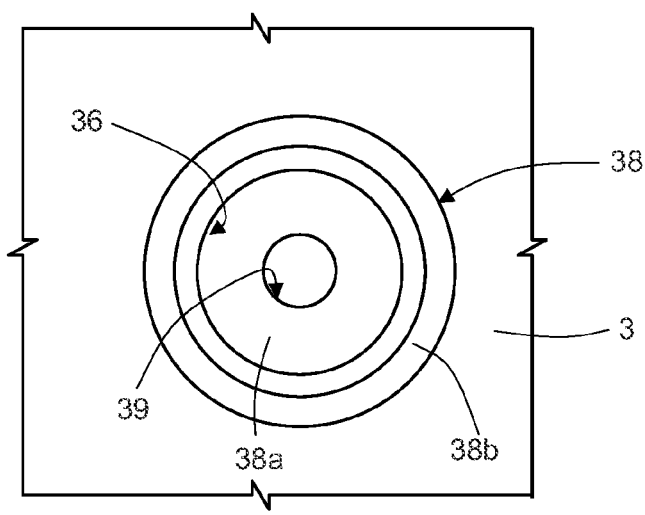
Figure 16A:
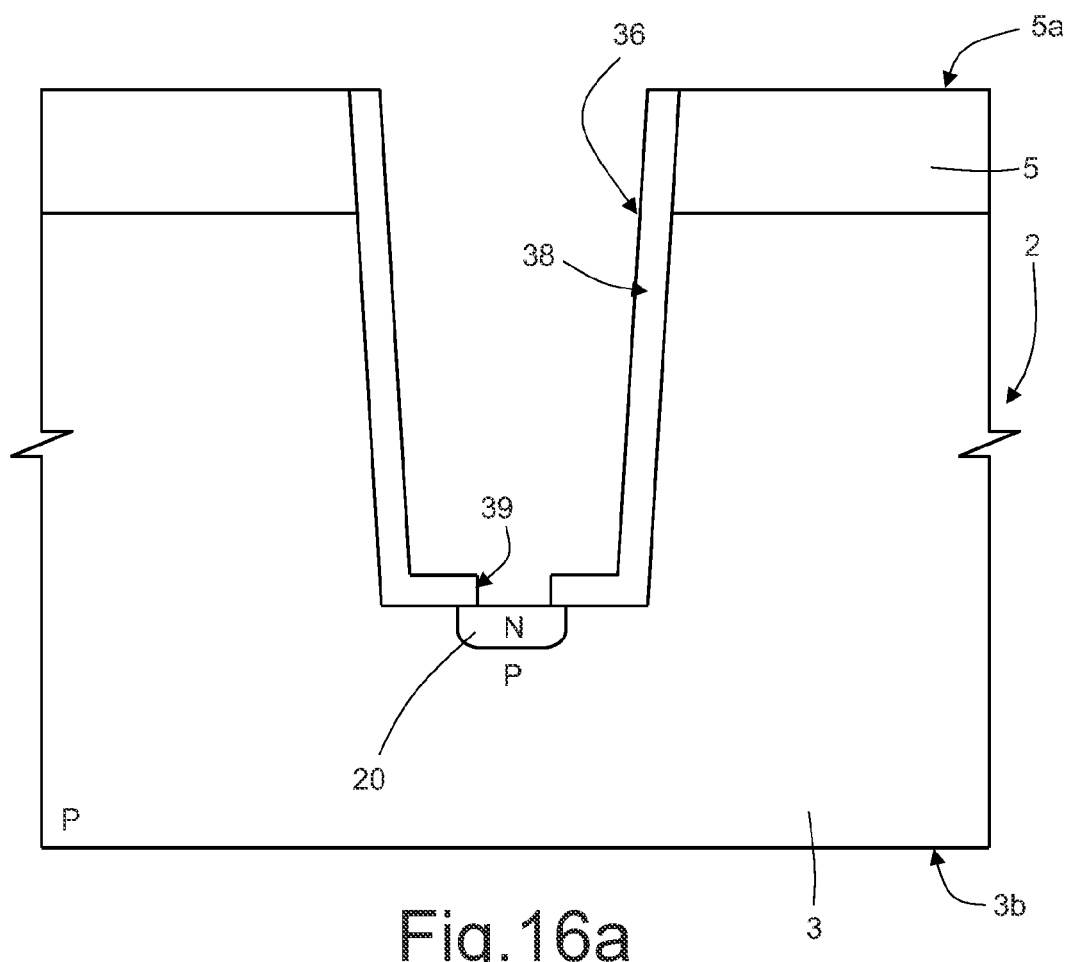
Figure 16B:
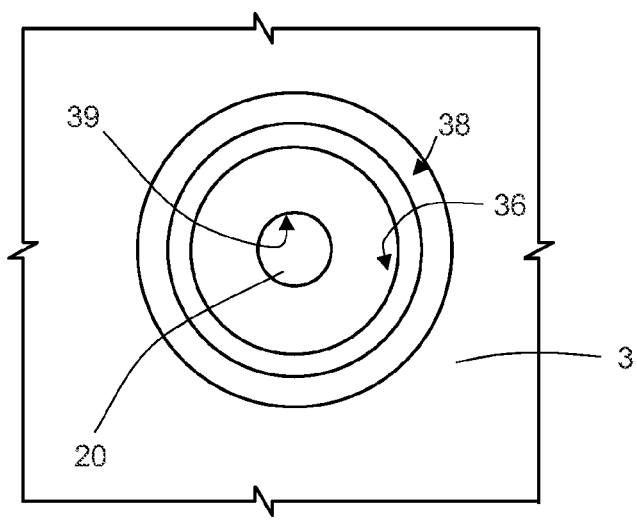
Figure 17:
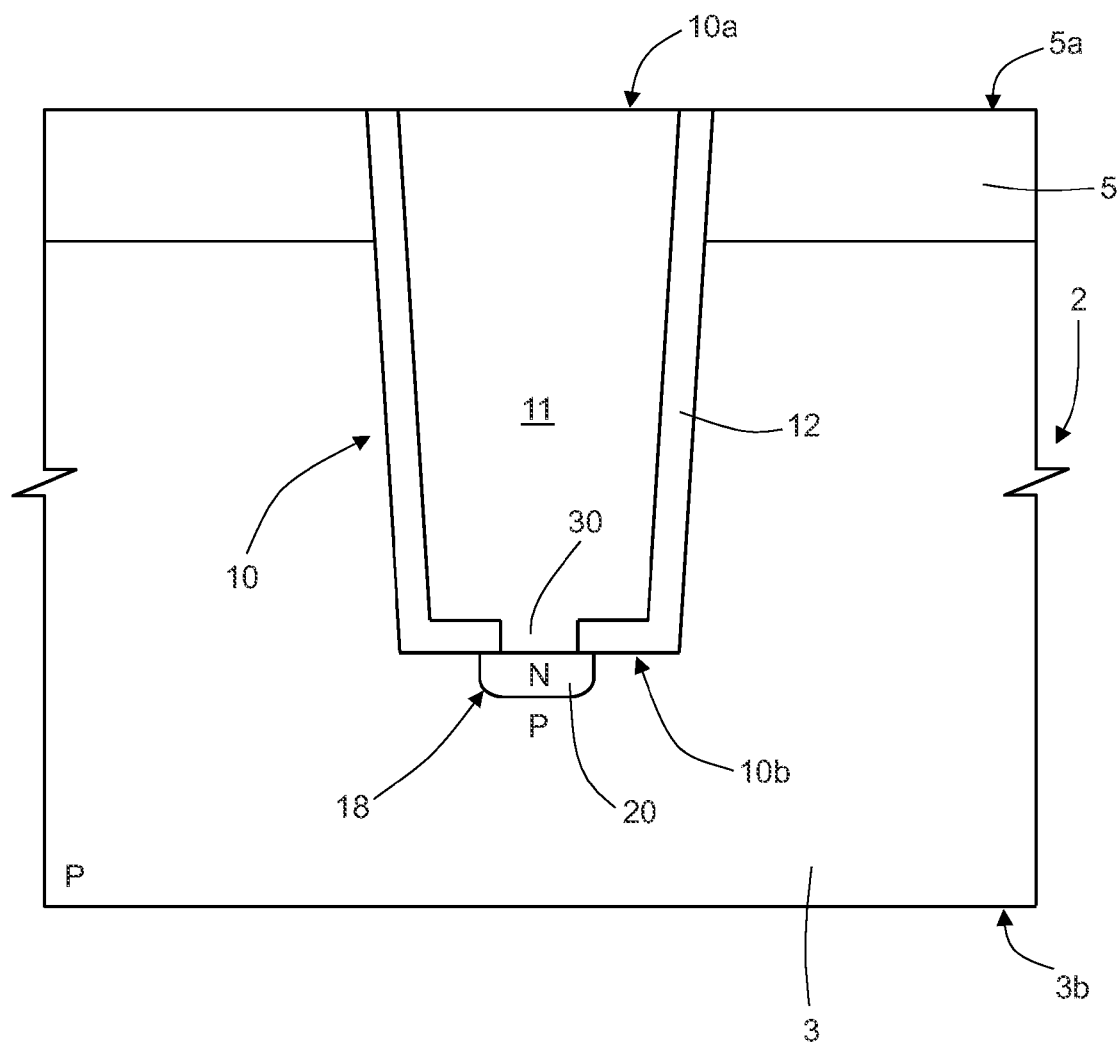
FIGS. 17-18 show sections through the body of semiconductor material in final steps of the manufacturing process for obtaining the testing system, according to the embodiment of FIGS. 13-16.
Figure 18:
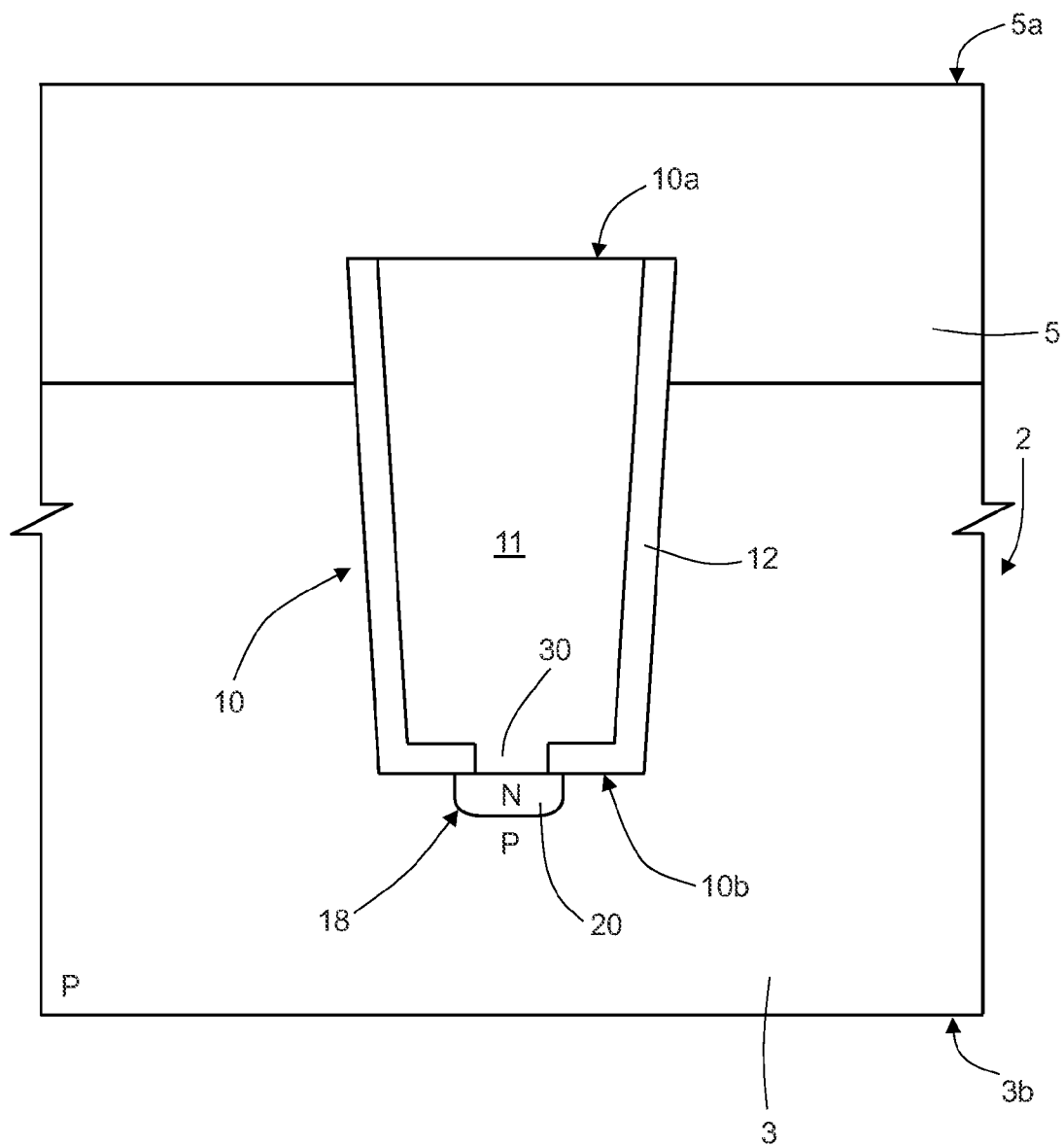

The process proceeds then in a way altogether equivalent to what has already been described previously for the first embodiment. For this reason, the subsequent steps are illustrated with reference to FIGS. 14-18, but are not described again in detail. It is only highlighted that, in the process step illustrated in FIG. 15a, the same laser beam 40, by means of an appropriate modification of the configuration of the lens system 41, may form the hole 39 at the bottom of the trench 36.

A variant embodiment of the testing system 1 is now described, in particular with respect to the through via 10 and the corresponding microelectronic buried structure 18. This variant includes modifications to the corresponding manufacturing process that will be altogether evident for a person skilled in the field (and that, for this reason, will not be described in detail herein).

In particular, this variant envisages formation, for each through via 10 that requires electrical testing, of a number of microelectronic buried structures 18, in such a way as to obtain a redundant configuration for execution of the electrical test.

In the case where one or more of the microelectronic buried structures 18 provided is defective, for example, owing to problems associated with the manufacturing process (for instance, on account of the reduced dimensions of the structures that are to be formed), thanks to the redundant configuration it will in any case be possible to carry out electrical testing of the through via 10, with modalities substantially similar to the ones already described previously.

Figure 19A:
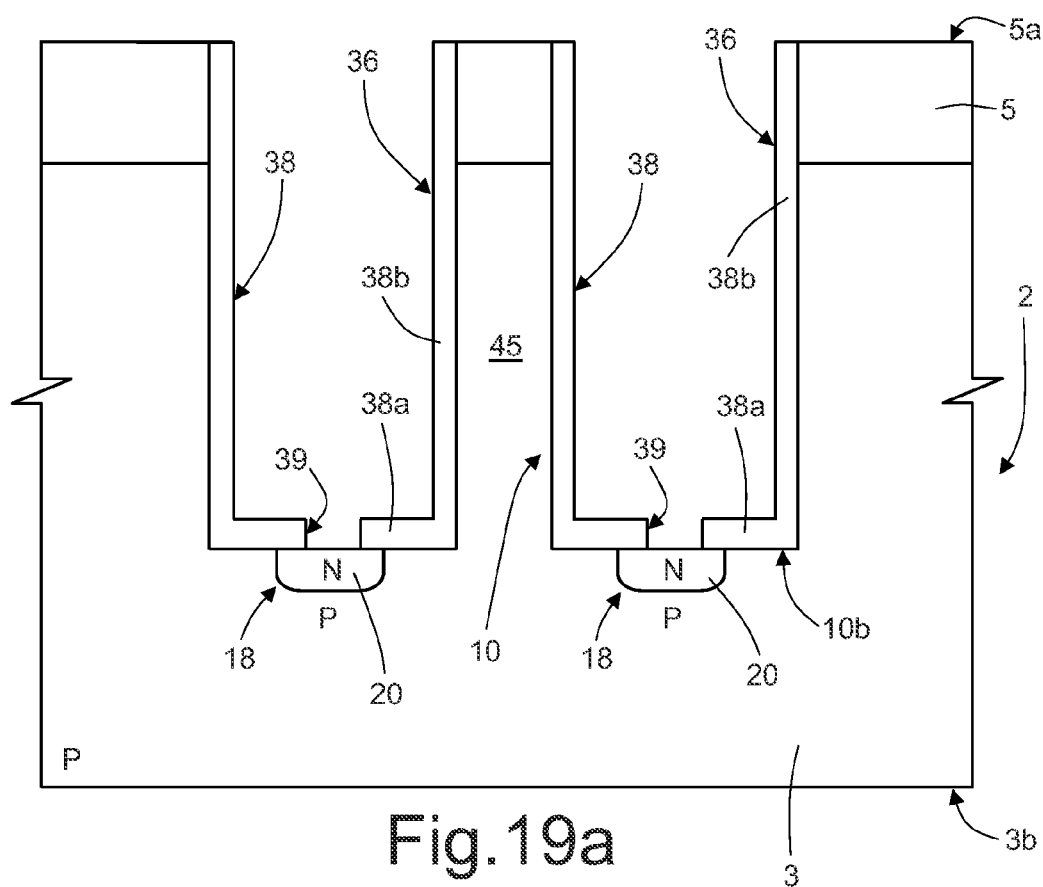
FIGS. 19a-19b show, respectively in cross section and in top plan view, a variant embodiment of the testing system, in an intermediate step of the manufacturing process.
Figure 19B:
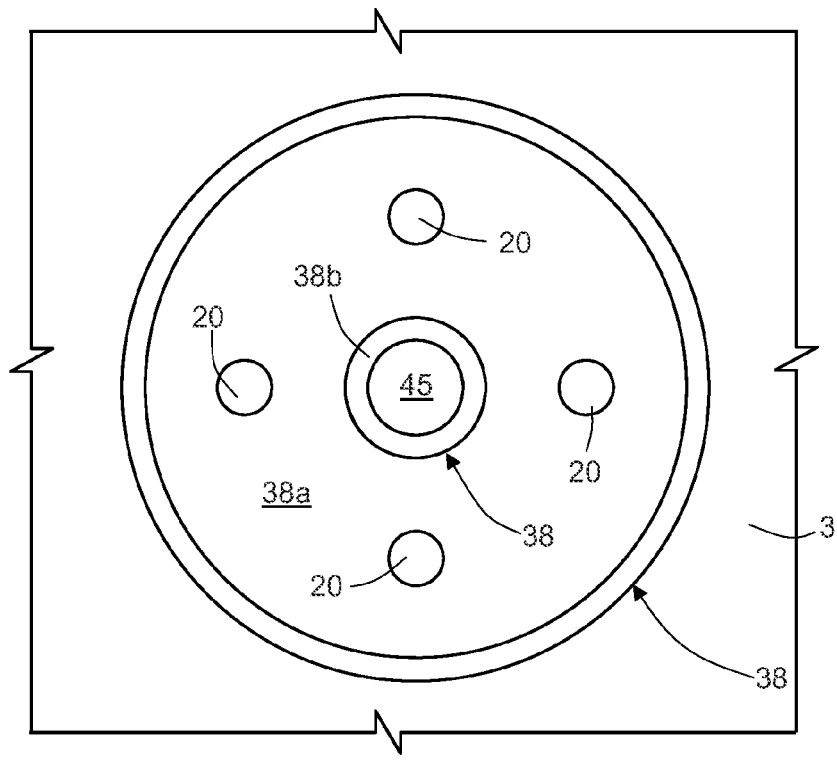

In detail, and with reference to FIGS. 19a, 19b, in contact with the bottom end 10b of the through via, which is once again designated by 10, a plurality of doped regions 20 are provided, for example, set at the same distance from one another, in the example illustrated four in number and arranged at the ends of a cross in the horizontal plane xy. The trench 36 made in the substrate 3 has in this case the conformation of a cylindrical ring, defining inside it a cylindrical portion of the substrate 3, designated by 45. In particular, the manufacturing process here envisages selective removal of material of the base 38a of the insulating coating 38 at the bottom of the trench 36 so as to define a number of holes 39 equal to the number of the doped regions 20. Also in this case, it is noted that the geometrical shape of the trench 36 is not to be considered in any way limiting.

One or more advantages of the testing system, and of the corresponding manufacturing process, are clear from the foregoing description.

In particular, it is once again emphasized that the reduction of the reverse saturation currents $I_S$ of the PN junctions of the microelectronic buried structures 18 makes it possible to render the electrical testing operations more reliable, reducing the risk of the same reverse saturation current $I_S$ masking the presence of defects associated with the through vias 10 or with the corresponding testing circuits 14 integrated in the body 2 of semiconductor material.

The described manufacturing process (in particular, by using the laser-ablation technique) proves particularly simple and fast, reducing in particular the number of masking and etching processes. In this regard, the second embodiment described, which envisages the total absence of masking processes for obtaining the through vias 10 and the corresponding testing structures, may be more advantageous in the case where the number of through vias 10 to be provided for each die is not excessively high (this being a case where the first embodiment, with the associated single masking and etching step for the initial formation of the trenches 36 may, instead, prove more advantageous).

Finally, it is clear that modifications and variations may be made to what has been described and illustrated herein without thereby departing from the scope of the present disclosure.

In particular, the microelectronic buried structure 18 of the testing circuit 14 may vary with respect to what has been described so far (including, in any case, at least one doped region 20 set between the through via 10 to be tested and the substrate 3 so as to define a semiconductor junction that will ensure, via an appropriate biasing, electrical insulation thereof in given operating conditions). In one or more alternative embodiments (not illustrated herein), the microelectronic buried structure 18 may, for example, envisage a BJT of a vertical or lateral type, or any other suitable electronic device.

In addition, the testing circuit 14 according to an embodiment may be configured for evaluating further electrical parameters of the through vias 10; for example, the electrical insulation from the substrate 3 in which they are integrated may be evaluated, so as to detect the presence of leakage towards the same substrate 3. In this case, the testing circuit 14 may be, for example, configured so as to enable application of a testing voltage across the semiconductor diode of the microelectronic buried structure 18 such as to bias it in a reverse-biased condition and so as to detect the amount of the losses towards the substrate 3.

From the foregoing it will be appreciated that, although specific embodiments have been described herein for purposes of illustration, various modifications may be made without deviating from the spirit and scope of the disclosure. Furthermore, where an alternative is disclosed for a particular embodiment, this alternative may also apply to other embodiments even if not specifically stated.

The invention claimed is:

1. A semiconductor structure, comprising:
   a substrate having a first type of conductivity;
   a first trench formed in the substrate and having a trench wall and a trench bottom;
   a first insulator having a wall layer disposed over the trench wall and having a bottom layer disposed on the trench bottom and extending inwardly from the wall layer;
   a first opening formed in the bottom layer disposed on the trench bottom, the first opening being smaller than the trench bottom;
   a first region of a second type of conductivity disposed in the substrate in alignment with the first opening, the first region having a width that is larger than a width of the first opening but smaller than a width extending between opposed inner edges of the wall layer for the first insulator; and
   a first conductor disposed in the trench over the first insulator and in contact with the first region through the first opening.

2. The semiconductor structure of claim 1 wherein:
   the first type of conductivity is P type; and
   the second type of conductivity is N type.

3. The semiconductor structure of claim 1 wherein the first opening is approximately circular.

4. The semiconductor structure of claim 1 wherein the first region is approximately circular, said width of the first region defining a diameter that is less than the width extending between inner edges of the wall layer for the first insulator.

5. The semiconductor structure of claim 1, further comprising:
   a first contact disposed over the substrate and coupled to the conductor; and
   a second contact disposed over and coupled to the substrate.

6. The semiconductor structure of claim 1, further comprising:
   a first contact disposed over the substrate;
   a first circuit coupling the first contact to the conductor;
   a second contact disposed over the substrate; and
   a second circuit coupling the second contact to the substrate.

7. The semiconductor structure of claim 1, further comprising:
   a second opening formed in the bottom layer disposed on the trench bottom, the second opening being smaller than the trench bottom;
   a second region of the second type of conductivity disposed in the substrate in alignment with the second opening, having a width that is larger than a width of the second opening but smaller than a width extending between inner edges of the wall layer for the first insulator; and
   wherein the conductor is in contact with the second region through the second opening.

8. The semiconductor structure of claim 1, further comprising:
   a second trench formed in the substrate and having a trench wall and a trench bottom;
   an second insulator having a wall layer disposed over the trench wall and having a bottom layer disposed on the trench bottom of the second trench and extending inwardly from the wall layer;
   a second opening formed in the bottom layer disposed on the trench bottom of the second trench, the second opening being smaller than the trench bottom of the second trench;
   a second region of the second type of conductivity disposed in the substrate in alignment with the second opening, the second region having a width that is larger than a width of the second opening but smaller than a width extending between inner edges of the wall layer for the second insulator; and
   a second conductor disposed in the second trench over the second insulator and in contact with the second region through the second opening.

9. The semiconductor structure of claim 1 wherein the trench wall is perpendicular to the trench bottom.

10. The semiconductor structure of claim 5, further comprising circuitry coupled to the first and second contacts and configured to:
    generate a voltage across a series combination of the substrate, a diode formed by the substrate and said first region, and the conductor; and
    analyze a current that flows through the diode and the conductor.

11. A semiconductor structure, comprising:
    a substrate having a first type of conductivity;
    a circular trench formed in the substrate to surround a central substrate portion and having an inner trench wall, an outer trench wall and a trench bottom;
    an insulator having a first wall layer disposed over the inner trench wall and having a second wall layer disposed over the outer trench wall and having a bottom layer disposed on the trench bottom and extending between the first and second wall layers;
    a first opening formed in the bottom layer disposed on the trench bottom, the first opening being smaller than a distance between an outer surface of the first wall layer and an inner surface of the second wall layer;
    a first region of a second type of conductivity disposed in the substrate in alignment with the first opening, the first region having a width that is larger than a width of the first opening but smaller than the distance between the outer surface of the first wall layer and the inner surface of the second wall layer; and
    a conductor disposed in the trench over the insulator and in contact with the first region through the first opening.

12. The structure of claim 11, further comprising:
    a second opening formed in the bottom layer disposed on the trench bottom, the second opening being smaller than a distance between the outer surface of the first wall layer and the inner surface of the second wall layer; and a second region of the second type of conductivity disposed in the substrate in alignment with the second opening, the second region having a width that is larger than a width of the second opening but smaller than the distance between the outer surface of the first wall layer and the inner surface of the second wall layer; and wherein the conductor disposed in the trench over the insulator is in contact with the second region through the second opening.

13. The structure of claim 11 wherein the inner and outer trench walls are perpendicular to the trench bottom.

14. The structure of claim 11 wherein:
the first type of conductivity is P type; and
the second type of conductivity is N type.

15. The structure of claim 11, further comprising:
a first contact disposed over the substrate and coupled to the conductor; and
a second contact disposed over and coupled to the substrate.

16. The structure of claim 15, further comprising circuitry coupled to the first and second contacts and configured to:

generate a voltage across a series combination of the substrate, a diode formed by the substrate and said first region, and the conductor; and analyze a current that flows through the diode and the conductor.

17. The structure of claim 11, wherein the first region and substrate form a diode, and the width of the first region sets a reverse saturation current for the diode that is less than a leakage current arising from a defect to be detected.

18. The semiconductor structure of claim 1, wherein the first region and substrate form a diode, and the width of the first region sets a reverse saturation current for the diode that is less than a leakage current arising from a defect to be detected.

* * * * *

UNITED STATES PATENT AND TRADEMARK OFFICE
CERTIFICATE OF CORRECTION

| | |
|---|---|
| PATENT NO. | : 9,478,470 B2 |
| APPLICATION NO. | : 13/855321 |
| DATED | : October 25, 2016 |
| INVENTOR(S) | : Alberto Pagani |

Page 1 of 1

It is certified that error appears in the above-identified patent and that said Letters Patent is hereby corrected as shown below:

On the Title Page:

Please correct Item (73) as follows:

Assignee: STMicroelectronics S.r.l., Agrate Brianza (IT)

Signed and Sealed this
Twentieth Day of December, 2016

Michelle K. Lee
*Director of the United States Patent and Trademark Office*